US012654425B2

(12) United States Patent
Akarapu et al.

(10) Patent No.: US 12,654,425 B2
(45) Date of Patent: Jun. 16, 2026

(54) GLASS POLYMER LAMINATES WITH COMPRESSIVE TOP LAYER

(71) Applicant: CORNING INCORPORATED, Corning, NY (US)

(72) Inventors: Ravindra Kumar Akarapu, San Diego, CA (US); Matthew John Dejneka, Corning, NY (US); Michael Edward DeRosa, Painted Post, NY (US); Diane Kimberlie Guilfoyle, Painted Post, NY (US); Camden Wayne Isenberg, Sioux Falls, SD (US); Manuela Ocampo Davila, Corning, NY (US); Shawn Michael O'Malley, Manchester, NH (US); Paul George Rickerl, Endicott, NY (US); Amber Leigh Tremper, Painted Post, NY (US); Erick Franklin VanDuyne, Corning, NY (US); Jonathan Earl Walter, Woodhull, NY (US)

(73) Assignee: CORNING INCORPORATED, Corning, NY (US)

( * ) Notice: Subject to any disclaimer, the term of this patent is extended or adjusted under 35 U.S.C. 154(b) by 268 days.

(21) Appl. No.: 18/037,471

(22) PCT Filed: Nov. 24, 2021

(86) PCT No.: PCT/US2021/060757
§ 371 (c)(1),
(2) Date: May 17, 2023

(87) PCT Pub. No.: WO2022/115557
PCT Pub. Date: Jun. 2, 2022

(65) Prior Publication Data
US 2023/0415456 A1 Dec. 28, 2023

Related U.S. Application Data

(60) Provisional application No. 63/119,100, filed on Nov. 30, 2020.

(51) Int. Cl.
*B32B 17/10* (2006.01)
*B32B 7/02* (2019.01)
(Continued)

(52) U.S. Cl.
CPC .......... *B32B 17/10045* (2013.01); *B32B 7/02* (2013.01); *B32B 17/101* (2013.01);
(Continued)

(58) Field of Classification Search
CPC ... B32B 17/10045; B32B 7/02; B32B 17/101; B32B 17/10137; B32B 17/10651;
(Continued)

(56) References Cited

U.S. PATENT DOCUMENTS

2012/0052302 A1    3/2012   Matusick et al.
2014/0356605 A1*   12/2014   Adib ...................... C03C 3/093
                                         65/30.13
(Continued)

FOREIGN PATENT DOCUMENTS

CN      102275363 A   *   12/2011
CN      105408107 A     3/2016
(Continued)

OTHER PUBLICATIONS

Martín, Marc, et al. "Polymeric interlayer materials for laminated glass: A review." Construction and building materials 230 (2020): 116897. (Year: 2019).*
(Continued)

*Primary Examiner* — Michael Zhang

(57) ABSTRACT
Laminated glass-based articles are provided. The glass-based articles include at least a first glass-based layer, a
(Continued)

300 second glass-based layer, and a polymer layer disposed between the first and second glass-based layers. The first glass-based layer includes a compressive stress. A difference between the coefficient of thermal of expansion of the first glass-based layer and the coefficient of thermal of expansion of the second glass-based layer is greater than or equal to 0.4 ppm/° C. Methods of producing the laminated glass-based articles are also provided.

15 Claims, 17 Drawing Sheets

(51) Int. Cl.
  *H05K 5/02* (2006.01)
  *H05K 5/03* (2006.01)
(52) U.S. Cl.
  CPC .. *B32B 17/10137* (2013.01); *B32B 17/10651* (2013.01); *B32B 17/10733* (2013.01); *B32B 17/10743* (2013.01); *B32B 17/10807* (2013.01); *H05K 5/0217* (2013.01); *H05K 5/03* (2013.01); *B32B 2307/54* (2013.01); *B32B 2307/558* (2013.01); *B32B 2307/584* (2013.01); *B32B 2307/7376* (2023.05); *B32B 2457/20* (2013.01)
(58) Field of Classification Search
  CPC ........ B32B 17/10733; B32B 17/10743; B32B 17/10807; B32B 2307/54; B32B 2307/558; B32B 2307/584; B32B 2307/7376; B32B 2457/20; B32B 2307/412; B32B 2307/50; B32B 2307/732; B32B 2457/208; B32B 17/10165; B32B 17/10871; B32B 17/1099; B32B 37/144; B32B 17/10036;
  B32B 17/1055; B32B 17/10614; H05K 5/0217; H05K 5/03
  See application file for complete search history.

(56) References Cited

U.S. PATENT DOCUMENTS

| | | | |
|---|---|---|---|
| 2015/0140299 A1* | 5/2015 | Ellison | C03C 3/093 |
| | | | 65/53 |
| 2015/0258750 A1 | 9/2015 | Kang et al. | |
| 2016/0136929 A1 | 5/2016 | Meiss et al. | |
| 2016/0193812 A1* | 7/2016 | Couillard | B32B 7/027 |
| | | | 156/60 |
| 2017/0197384 A1 | 7/2017 | Finkeldey et al. | |
| 2017/0369989 A1* | 12/2017 | Cherekdjian | C03C 3/097 |
| 2019/0107762 A1* | 4/2019 | Nakamura | B32B 17/10853 |
| 2019/0134944 A1* | 5/2019 | Dawson-Elli | B32B 17/10761 |
| 2022/0185717 A1* | 6/2022 | Bhatia | B32B 17/06 |

FOREIGN PATENT DOCUMENTS

| | | |
|---|---|---|
| CN | 108698922 A | 10/2018 |
| JP | 2006-008476 A | 1/2006 |

OTHER PUBLICATIONS

Gy, Rene. "Ion exchange for glass strengthening." Materials Science and Engineering: B 149.2 (2008): 159-165. (Year: 2008).*
ip.com translation of CN-102275363-A (Year: 2025).*
International Search Report and Written Opinion of the International Searching Authority; PCT/US2021/060757; mailed on Mar. 16, 2022, 15 pages; European Patent Office.
Chinese Patent Application No. 202180092217.8 , Office Action dated Aug. 16, 2025, 5 pages (English Translation only), Chinese Patent Office.

* cited by examiner

Laminate 3

IOX Monolith 3

Laminate 2

IOX Monolith 2

Laminate 1

IOX Monolith 1

GLASS POLYMER LAMINATES WITH COMPRESSIVE TOP LAYER

This is a US national stage application under 35 U.S.C. § 371 of International Patent Application PCT/US2021/060757 filed on Nov. 24, 2021, which claims the benefit of U.S. Provisional Application 63/119,100 filed on Nov. 30, 2020, the content of each of which is relied upon and incorporated herein by reference in its entirety.

BACKGROUND

Field

The present specification generally relates to laminated glass-based articles and, more specifically, to laminated glass-based articles comprising glass layers separated by a polymer adhesive layer with a compressive top layer and methods of forming the same.

Technical Background

Glass articles, such as cover glasses, glass backplates and the like, are employed in both consumer and commercial electronic devices such as LCD and LED displays, computer monitors, automated teller machines (ATMs), and the like. Some of these glass articles may include "touch" functionality which necessitates that the glass article be contacted by various objects including a user's fingers and/or stylus devices and, as such, the glass must be sufficiently robust to endure regular contact without damage, such as scratching. Indeed, scratches introduced into the surface of the glass article may reduce the strength of the glass article as the scratches may serve as initiation points for cracks leading to catastrophic failure of the glass.

Moreover, such glass articles may also be incorporated in portable electronic devices, such as mobile telephones, personal media players, laptop computers and tablet computers. The glass articles incorporated in these devices may be susceptible to sharp impact damage during transport and/or use of the associated device. Sharp impact damage may include, for example, damage caused by dropping the device. Such mechanical damage may lead to failure of the glass.

Accordingly, a need exists for alternative glass articles that are resistant to failure due to mechanical damage incident on the surfaces and edges of the glass article.

SUMMARY

According to aspect (1), an article is provided. The article comprises: a first glass-based layer having a thickness $t_{G1}$ and a coefficient of thermal expansion $CTE_{G1}$; a second glass-based layer having a thickness $t_{G2}$ and a coefficient of thermal expansion $CTE_{G2}$; and a first polymer layer disposed between the first glass-based layer and the second glass-based layer having a thickness $t_{P1}$ and a coefficient of thermal expansion $CTE_{P1}$, wherein the first glass-based layer comprises a compressive stress, and $|CTE_{G1}-CTE_{G2}|>0.4$ ppm/° C.

According to aspect (2), the article of aspect (1) is provided, further comprising: a third glass-based layer having a thickness $t_{G3}$ and a coefficient of thermal expansion $CTE_{G3}$; and a second polymer layer disposed between the second glass-based layer and the third glass-based layer having a thickness $t_{P2}$ and a coefficient of thermal expansion $CTE_{P2}$, wherein the third glass-based layer comprises a compressive stress, and $|CTE_{G3}-CTE_{G2}|>0.4$ ppm/° C.

According to aspect (3), the article of aspect (2) is provided, wherein $t_{G1}=t_{G3}$.

According to aspect (4), the article of any of aspect (2) to the preceding aspect is provided, wherein $t_{G3}\leq300$ μm.

According to aspect (5), the article of any of aspect (2) to the preceding aspect is provided, wherein $t_{P2}\leq150$ μm.

According to aspect (6), the article of any of aspect (2) to the preceding aspect is provided, wherein the first glass-based layer and the third glass-based layer have the same composition.

According to aspect (7), the article of any of aspect (2) to the preceding aspect is provided, wherein the first polymer layer and the second polymer layer have the same composition.

According to aspect (8), the article of any of aspect (2) to the preceding aspect is provided, wherein: $|CTE_{G3}-CTE_{G2}|>0.5$ ppm/° C.

According to aspect (9), the article of any of aspect (1) to the preceding aspect is provided, wherein $t_{G1}\leq300$ μm.

According to aspect (10), the article of any of aspect (1) to the preceding aspect is provided, wherein $t_{G2}\geq200$ μm.

According to aspect (11), the article of any of aspect (1) to the preceding aspect is provided, wherein $t_{G1}+t_{G2}+t_{P1}<20$ mm.

According to aspect (12), the article of any of aspect (1) to the preceding aspect is provided, wherein $t_{P1}\leq150$ μm.

According to aspect (13), the article of any of aspect (1) to the preceding aspect is provided, wherein $CTE_{G1}<CTE_{G2}$.

According to aspect (14), the article of any of aspect (1) to the preceding aspect is provided, wherein $CTE_{G1}>CTE_{G2}$.

According to aspect (15), the article of any of aspect (1) to the preceding aspect is provided, wherein $|CTE_{G1}-CTE_{G2}|>0.5$ ppm/° C.

According to aspect (16), the article of any of aspect (1) to the preceding aspect is provided, wherein the first glass-based layer comprises a compressive stress greater than or equal to 5 MPa.

According to aspect (17), the article of any of aspect (1) to the preceding aspect is provided, wherein the first glass-based layer comprises an average compressive stress greater than or equal to 5 MPa and the compressive stress varies over the thickness of the first glass-based layer by less than 20% of the average compressive stress.

According to aspect (18), the article of any of aspect (1) to the preceding aspect is provided, wherein the first glass-based layer comprises a compressive stress greater than or equal to 200 MPa.

According to aspect (19), the article of any of aspect (1) to the preceding aspect is provided, wherein $CTE_{P1}-(CTE_{G1}+CTE_{G2})/2>1$ ppm/° C.

According to aspect (20), the article of any of aspect (1) to the preceding aspect is provided, wherein the first polymer layer has a glass transition temperature of greater than or equal to 20° C.

According to aspect (21), the article of any of aspect (1) to the preceding aspect is provided, wherein the first polymer layer has a storage modulus of greater than or equal to 5 MPa and less than or equal to 20,000 MPa at temperatures between 0° C. and 40° C.

According to aspect (22), the article of any of aspect (1) to the preceding aspect is provided, wherein the second glass-based layer has a Young's modulus of greater than or equal to 5 GPa.

According to aspect (23), the article of any of aspect (1) to the preceding aspect is provided, wherein the second glass-based layer has a Young's modulus that is greater than a Young's modulus of the first polymer layer.

According to aspect (24), the article of any of aspect (1) to the preceding aspect is provided, wherein the first glass-based layer has a Knoop scratch threshold greater than or equal to 6 N.

According to aspect (25), the article of any of aspect (1) to the preceding aspect is provided, wherein the first glass-based layer comprises an aluminoborosilicate glass.

According to aspect (26), the article of any of aspect (1) to the preceding aspect is provided, wherein the second glass-based layer comprises an aluminosilicate glass.

According to aspect (27), the article of any of aspect (1) to the preceding aspect is provided, wherein the second glass-based layer comprises a soda-lime glass.

According to aspect (28), the article of any of aspect (1) to the preceding aspect is provided, wherein the second glass-based layer comprises a compressive stress greater than or equal to 200 MPa.

According to aspect (29), the article of any of aspect (1) to the preceding aspect is provided, wherein the first polymer layer comprises carbon nanotubes.

According to aspect (30), the article of any of aspect (1) to the preceding aspect is provided, wherein the first polymer layer comprises a colorant.

According to aspect (31), the article of any of aspect (1) to the preceding aspect is provided, wherein the first polymer layer does not exhibit brittle deformation behavior at 20° C.

According to aspect (32), a consumer electronic product is provided. The consumer electronic product comprises: a housing having a front surface, a back surface and side surfaces; electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the article of any of the preceding aspects.

According to aspect (33), a method is provided. The method comprises: disposing a first polymer layer between a first glass-based layer and a second glass-based layer; and curing the first polymer in an environment at a curing temperature $T_C$ to form an article, wherein the first glass-based layer has a thickness $t_{G1}$ and a coefficient of thermal expansion $CTE_{G1}$, the second glass-based layer has a thickness $t_{G2}$ and a coefficient of thermal expansion $CTE_{G2}$, the first polymer layer has a thickness $t_{P1}$ and a coefficient of thermal expansion $CTE_{P1}$, the first glass-based layer comprises a compressive stress, $|CTE_{G1}-CTE_{G2}|>0.4$ ppm/° C., and $|T_C-20°$ C.$|\geq10°$ C.

According to aspect (34), the method of aspect (33) is provided, wherein $T_C>30°$ C. and $CTE_{G2}>CTE_{G1}$.

According to aspect (35), the method of any of aspect (33) to the preceding aspect is provided, wherein the first polymer layer has a glass transition temperature $T_{gP1}$, wherein $T_C \geq T_{gP1}+10°$ C.

According to aspect (36), the method of any of aspect (33) to the preceding aspect is provided, wherein after curing the article is heated to a temperature greater than or equal to 40° C.

According to aspect (37), the method of any of aspect (33) to the preceding aspect is provided, wherein the curing induces a shrinkage in the first polymer layer of greater than or equal to 1%.

According to aspect (38), the method of any of aspect (33) to the preceding aspect is provided, wherein $T_C \leq 0°$ C. and $CTE_{G1}>CTE_{G2}$.

According to aspect (39), the method of any of aspect (33) to the preceding aspect is provided, wherein the disposing comprises flexographic or gravure printing.

According to aspect (40), the method of any of aspect (33) to the preceding aspect is provided, wherein the curing comprises irradiating the first polymer layer with ultraviolet light.

According to aspect (41), the method of any of aspect (33) to the preceding aspect is provided, wherein the curing comprises heat treating the first polymer layer.

According to aspect (42), the method of any of aspect (33) to the preceding aspect is provided, wherein $|CTE_{G1}-CTE_{G2}|>0.5$ ppm/° C.

Additional features and advantages of the laminated glass articles and methods for forming the same described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments and are incorporated into and constitute a part of this specification. The drawings illustrate the various embodiments described herein, and together with the description serve to explain the principles and operations of the claimed subject matter.

DETAILED DESCRIPTION

Figure 1:
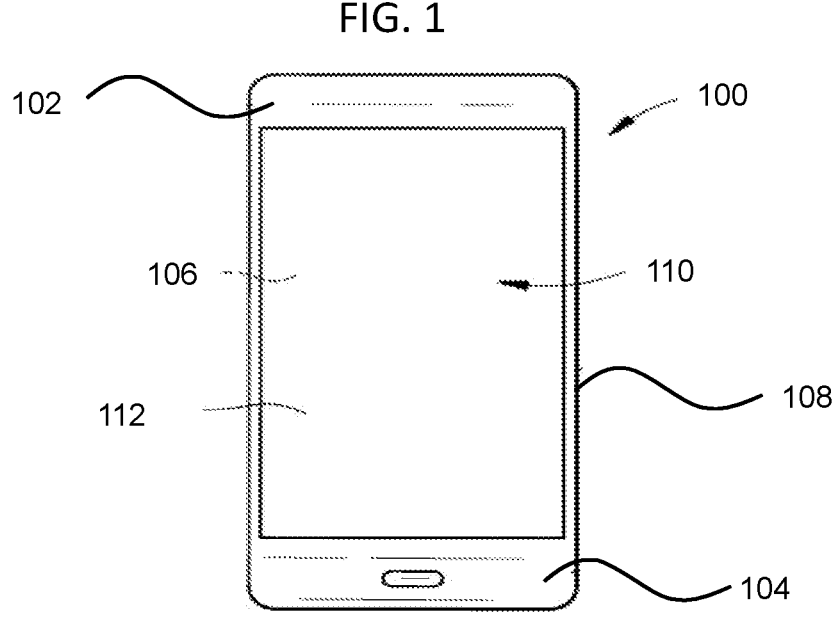
FIG. 1 schematically depicts a front view of a consumer electronic device comprising a glass-based article, according to one or more embodiments described herein.

Reference will now be made in detail to embodiments of glass-based articles comprising a plurality of glass-based layers and polymer layers disposed between the glass-based layers, examples of which are illustrated in the accompanying drawings.

Ranges can be expressed herein as from "about" one particular value, and/or to "about" another particular value. When such a range is expressed, another embodiment includes from the one particular value and/or to the other particular value (i.e., the range is inclusive of the expressly stated endpoints). Similarly, when values are expressed as approximations, by use of the antecedent "about," it will be understood that the particular value forms another embodiment. For example, the range "from about 1 to about 2" also expressly includes the range "from 1 to 2". Similarly, the range "about 1 to about 2" also expressly includes the range of "1 to 2". It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise.

The glass-based articles described herein are laminates of at least two glass-based layers and a polymer layer disposed between the glass-based layers. The glass-based layers are characterized by a difference in coefficient of thermal expansion of at least 0.4 ppm/° C. At least one of the glass-based layers includes a compressive stress. The resistance to breakage of the glass-based article may exceed that of chemically strengthened monolithic glass-based articles with a similar thickness, as indicated by the result of drop tests. Additionally, in the event of failure the optical properties of the glass-based articles are preserved in a manner that may allow the continued operation of an electronic device in which the glass-based article is incorporated. For example, cracks in the glass-based articles described herein may be significantly less visible than in chemically strengthened monolithic glass-based articles with a similar thickness.

The glass-based articles described herein provide a high resistance to fracture without requiring chemical strengthening or thermal tempering of the individual glass-based layers. For this reason, the manufacturing of the glass-based articles may be simplified and cost may be reduced. Additionally, the ability to achieve high fracture resistance without requiring ion exchange strengthening allows the individual glass-based layers to be free or substantially free of alkali metals, which are undesirable in some electronic device applications. As utilized herein, the term "substantially free" indicates that a component is not actively added to a composition, but may be present in amounts less than or equal to 0.01 mol % as an impurity. The term "glass-based" is used herein to include any object made wholly or partly of glass, such as glasses and glass-ceramics (including an amorphous phase and a crystalline phase).

Figure 2:
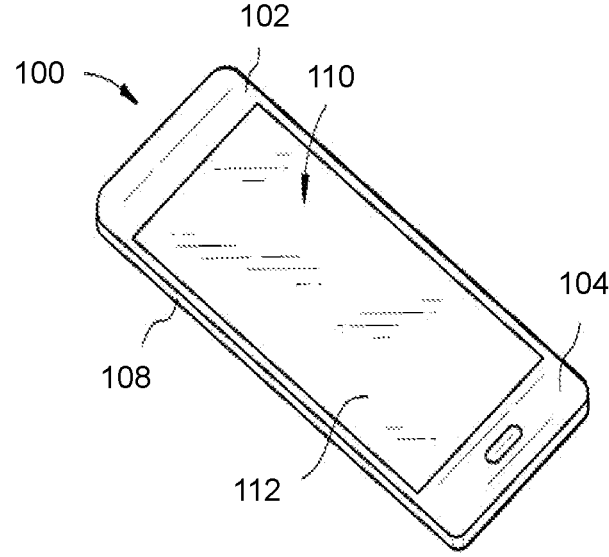
FIG. 2 schematically depicts a perspective view of the consumer electronic device of FIG. 1.

The laminated glass-based articles disclosed herein may be incorporated into other articles such as articles with displays (or display articles) (e.g., consumer electronics, including monitors, televisions, mobile phones, tablets, computers, navigation systems, wearable devices (e.g., watches) and the like), architectural articles, transportation articles (e.g., windows for vehicles including cars, trucks, trains, aircraft, sea craft, etc.), appliance articles, or any article that requires some transparency and improved resistance to damage. An exemplary article incorporating any of the laminated glass-based articles disclosed herein is schematically depicted in FIGS. 1 and 2. Specifically, FIGS. 1 and 2 show a consumer electronic device 100 including a housing 102 having front 104, back 106, and side surfaces 108; electrical components (not shown) that are at least partially inside or entirely within the housing and including at least a controller, a memory, and a display 110 at or adjacent to the front surface of the housing; and a cover substrate 112 at or over the front surface of the housing such that it is over the display. In some embodiments, at least a portion of at least one of the cover substrate 112 and the housing 102 may include any of the laminated glass-based articles disclosed herein.

The glass-based articles described herein include at least a first glass-based layer, a second glass-based layer, and a first polymer layer disposed between the first glass-based layer and the second glass-based layer. The individual glass-based layers and polymer layers included in the glass-based article may be selected to have any of the characteristics described below.

Figure 3:
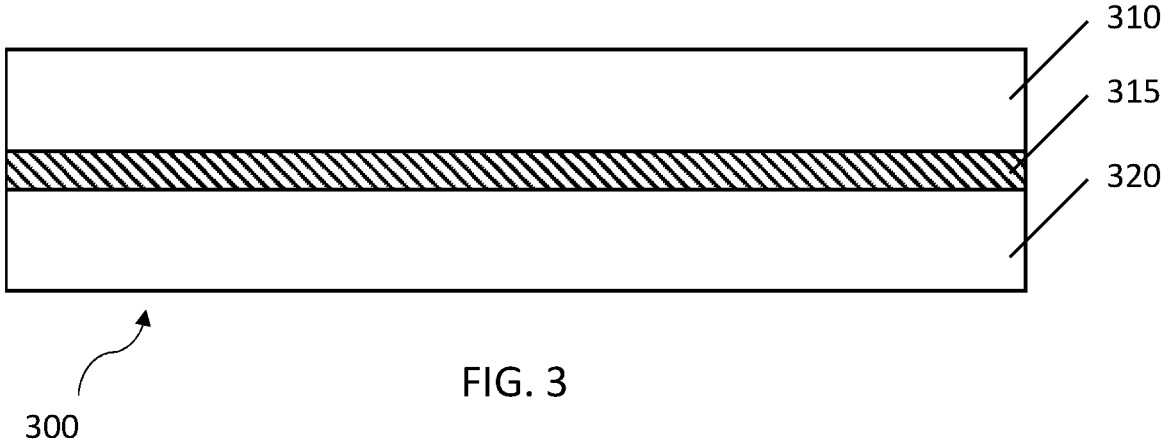
FIG. 3 schematically depicts a cross section of a glass-based article, according to one or more embodiments shown and described herein.
Figure 4:
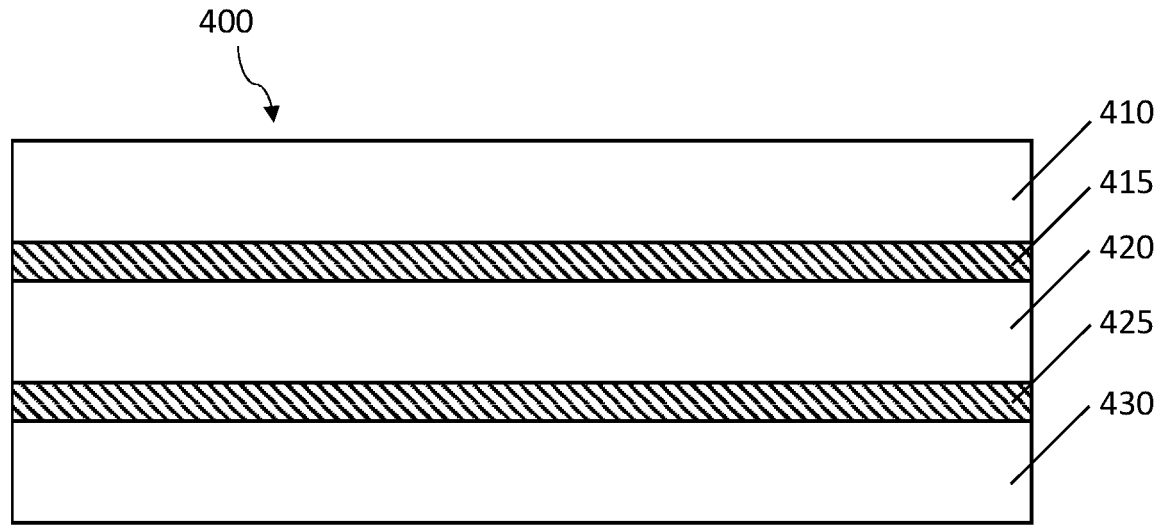
FIG. 4 schematically depicts a cross section of a glass-based article, according to one or more embodiments shown and described herein.

An exemplary glass-based article is illustrated in FIG. 3. The glass-based article 300 in FIG. 3 includes a first glass-based layer 310, a second glass-based layer 320, and a first polymer layer 315 disposed between the glass-based layers. In embodiments, the glass-based articles may include additional glass-based layers. As shown in FIG. 4, the glass-based article 400 includes a first glass-based layer 410, a first polymer layer 415, a second glass-based layer 420, a second polymer layer 425, and a third glass-based layer 430. While the glass-based article shown in FIG. 4 includes three glass-based layers, the glass-based articles described herein may include any number of glass-based layers greater than or equal to two. For example, the glass-based article may include greater than or equal to three glass-based layers, such as greater than or equal to four glass-based layers, greater than or equal to five glass-based layers, greater than or equal to six glass-based layers, or more. In general, the glass-based article may include one less polymer layer than the number of glass-based layers. As shown in FIGS. 3 and 4, the outer planar surfaces of the glass-based articles may be formed by a glass-based layer. For this reason, at least some of the properties of the glass-based article, may be attributable and substantially similar to the properties of the outer/exposed glass-based layer.

The first glass-based layer may have a coefficient of thermal expansion (CTE) that is substantially different than the CTE of the second glass-based layer. For example, the first glass-based layer may have a low CTE while the second glass-based layer exhibits a higher CTE. The polymer layer may include a UV or thermal cure polymer. Curing the polymer at a temperature distanced from the intended usage temperature (such as room temperature) leads to the CTE differential between the glass-based layers to create a compressive stress on the first glass-based layer as the laminate is returned to room temperature. The compressive stress on the first glass-based layer provides increased damage resistance and improved scratch performance. Any cracks that do form in the first glass-based layer are arrested at the polymer interface due to the ductile deformation of the polymer layer (unlike the brittle deformation at the interface in fused laminates) and do not propagate into the second glass-based layer, reducing the visibility of the cracks and preventing catastrophic failure of the laminate. The polymer is thin and selected to be stiff, preventing sharp flexure and breakage of the glass-based layers while protecting the back surface of the glass-based layers from flaws that can lead to failure. Keeping the first glass-based layer thin also minimizes the visibility of cracks therein. Using a damage resistant material with excellent scratch performance, such as alkaline earth aluminoborosilicates or alkali aluminoborosilicates, for the first glass-based layer provides further improved scratch performance than ion exchanged glass materials, which are more prone to lateral cracking because of their large surface stress gradient. Thinner polymer layers, higher polymer modulus, higher Tg, and lower ductile to brittle transformation temperature also provide improved performance. The glass-based layers can also be chemically strengthened to further enhance mechanical performance, especially where increased cost is not a barrier. In addition to a variety of UV and thermally curable polymers, film polymer laminations may be employed.

The glass-based laminate articles described herein provide a number of advantages when compared to monolithic chemically or thermally strengthened glass-based articles, such as those that are commercially available. The laminate structure provides performance comparable to that of chemically strengthened glass articles without requiring an ion exchange treatment, reducing cost for the same level of performance. For example, the glass-based laminate articles described herein may exhibit drop height to failure and scratch performance comparable to or exceeding that of monolithic chemically strengthened glass-based articles of similar thickness. The visibility of defects in the glass-based laminate articles is less objectionable over a broader range of impact events than monolithic chemically strengthened glass-based articles, reducing the frequency of replacement during usage. The glass-based laminate articles may exhibit some degree of self-healing, such that cracks that do form become less visible over time. The glass-based laminate articles described herein may be cut from "mother" sheets to desired part size even after the introduction of the compressive stress, which is difficult or impossible with monolithic chemically strengthened glass-based articles. The glass-based laminate articles may also be considered repairable, such that the application of a curable resin may reduce the appearance of cracks.

The compressive stress in the glass-based articles described herein is produced as a result of the coefficient of thermal expansion mismatch between the glass-based layers. The polymer adhesive is cured at a temperature different than the intended usage temperature (typically room temperature), and as the laminate is returned to the usage temperature the volumetric change of the higher coefficient of thermal expansion (CTE) glass-based layers is larger than the volumetric change of the lower CTE glass-based layers, which produces a compressive stress in the glass-based article. The stress generated by the CTE mismatch in glass-based articles containing three glass-based layers where the two outer glass-based layers are the same can be calculated by the formula:

$$\sigma_{G1} = t_{G2} * E_{G2} * E_{G1} \frac{(T_C - 20^\circ \text{C.})(CTE_{G1} - CTE_{G2})}{t_{G2} * E_{G2}(1 - v_{G1}) + 2 * t_{G1} * E_{G1}(1 - v_{G2})}$$

where $\sigma_{G1}$ is the stress in the outer glass-based layers, $t_{G1}$ is the thickness of the outer glass-based layers, $t_{G2}$ is the thickness of the central glass-based layer, $E_{G1}$ is the Young's modulus of the outer glass-based layers, $E_{G2}$ is the Young's modulus of the central glass-based layer, $T_c$ is the curing temperature, 20° C. is room temperature (the intended usage temperature), $CTE_{G1}$ is the coefficient of thermal expansion of the outer glass-based layers, $CTE_{G2}$ is the coefficient of thermal expansion of the central glass-based layer, $V_{G1}$ is the Poisson's ratio of the outer glass-based layers, and $V_{G2}$ is the Poisson's ratio of the central glass-based layer.

As demonstrated by the above formula, the greater the CTE difference and the greater the temperature difference between the temperature at which the polymer layer was cured and the usage temperature, the greater the compressive stress produced. Of course, there must be a balancing tensile stress central glass-based layer to balance the compressive stress, and this tensile stress is proportional to the ratio of the thickness of the outer glass-based layers to the thickness of the central glass-based layers, as given by:

$$\sigma_{G2} = -\sigma_{G1} * 2 \frac{t_{G1}}{t_{G2}}$$

where $\sigma_{G2}$ is the stress in the central glass-based layer.

In addition to CTE values of glass-based layers, the glass relaxation behavior of polymer has a considerable influence on the final stress state in the glass-based laminate articles. Glass transition temperature, processing temperature, cooling rate and elastic modulus of the polymer in rubbery state are important controlling parameters.

The polymer layer of the glass-based articles described herein serves multiple purposes. Perhaps most importantly, the polymer layer provides the mechanical bond between the glass-based layers. The shrinkage of the polymer layer during the curing process imparts an additional compressive stress force on the glass-based layers to which it is bonded and is a reason that the exemplary glass-based articles exhibit slightly more compressive stress than attributable to just the CTE mismatch between the glass-based layers. This additional compression adds to the damage resistance and strength of the glass-based articles. Additionally, the polymer layer deflects and arrests any cracks that may propagate from one glass-based layer into another. Thus, if the surface of a central glass-based layer is pristine and free of strength limiting flaws it is expected to remain so during use because it is protected by the outer glass-based layer and polymer layer, imparting great strength to the glass-based article even if the outer glass-based layer is insulted or damaged. In order to act in this manner, the polymer ductile to brittle transformation temperature should be low, such that the deformation in the polymer layer is either purely elastic or elastic/plastic/viscoplastic. Finally, the polymer layer helps to hold any cracks that do form in the glass-based layers closed.

The details of the glass-based articles will now be described. The glass-based articles include a first glass-based layer having a thickness $t_{G1}$ and a coefficient of thermal expansion $CTE_{G1}$; a second glass-based layer having a thickness $t_{G2}$ and a coefficient of thermal expansion $CTE_{G2}$; and a first polymer layer disposed between the first glass-based layer and the second glass-based layer having a thickness $t_{P1}$ and a coefficient of thermal expansion $CTE_{P1}$. The difference between $CTE_{G1}$ and $CTE_{G2}$ is greater than or equal to 0.4 ppm/° C. The first glass-based layer includes a compressive stress.

In embodiments, the glass-based articles disclosed herein include at least one glass-based layer with a thickness of less than or equal to 300 µm, such as less than or equal to 200 µm. The low thicknesses of the glass-based layers allows the layers to bend and dissipate impact energy, reducing or preventing fracture. Additionally, the thinness of the glass-based layers may reduce the visibility of any cracks that do form in the glass-based layers. In embodiments, the first glass-based layer has a thickness $t_{G1}$ of less than or equal to 300 µm, such as less than or equal to 200 µm, less than or equal to 190 µm, less than or equal to 180 µm, less than or equal to 170 µm, less than or equal to 160 µm, less than or equal to 150 µm, less than or equal to 140 µm, less than or equal to 130 µm, less than or equal to 120 µm, less than or equal to 110 µm, less than or equal to 100 µm, less than or equal to 90 µm, or less. In embodiments, the first glass-based layer has a thickness $t_{G1}$ of from greater than or equal to 90 µm to less than or equal to 300 µm, such as from greater than or equal to 90 µm to less than or equal to 200 µm, from greater than or equal to 100 µm to less than or equal to 190 µm, from greater than or equal to 110 µm to less than or equal to 180 µm, from greater than or equal to 120 µm to less than or equal to 170 µm, from greater than or equal to 130 µm to less than or equal to 160 µm, from greater than or equal to 140 µm to less than or equal to 150 µm, and any and all sub-ranges formed from any of these endpoints.

In embodiments, the glass-based articles disclosed herein include at least one glass-based layer with a thickness of greater than or equal to 200 µm, such as greater than or equal to 300 µm. The glass-based layers with relatively higher thicknesses increases the resistance of the glass-based articles to crack growth. In embodiments, the second glass-based layer has a thickness $t_{G2}$ of greater than or equal to 200 µm, such as greater than or equal to 300 µm, greater than or equal to 350 µm, greater than or equal to 400 µm, greater than or equal to 450 µm, greater than or equal to 500 µm, greater than or equal to 550 µm, greater than or equal to 600 µm, greater than or equal to 650 µm, greater than or equal to 700 µm, greater than or equal to 750 µm, greater than or equal to 800 µm, greater than or equal to 850 µm, greater than or equal to 900 µm, greater than or equal to 950 µm, greater than or equal to 1000 µm, greater than or equal to 1050 µm, greater than or equal to 1100 µm, greater than or equal to 1150 µm, greater than or equal to 1200 µm, greater than or equal to 1250 µm, greater than or equal to 1300 µm, greater than or equal to 1350 µm, greater than or equal to 1400 µm, greater than or equal to 1450 µm, greater than or equal to 1500 µm, greater than or equal to 1550 µm, greater than or equal to 1600 µm, greater than or equal to 310 µm, greater than or equal to 310 µm, greater than or equal to 310 µm, greater than or equal to 1650 µm, greater than or equal to 1700 µm, greater than or equal to 1750 µm, greater than or equal to 1800 µm, greater than or equal to 1850 µm, greater than or equal to 1900 µm, greater than or equal to 1950 µm, or more. In embodiments, the second glass-based layer has a thickness $t_{G2}$ of from greater than or equal to 200 µm to less than or equal to 2000 µm, such as greater than or equal to 300 µm to less than or equal to 2000 µm, greater than or equal to 350 µm to less than or equal to 1950 µm, greater than or equal to 400 µm to less than or equal to 1900 µm, greater than or equal to 450 µm to less than or equal to 1850 µm, greater than or equal to 500 µm to less than or equal to 1800 µm, greater than or equal to 550 µm to less than or equal to 1750 µm, greater than or equal to 600 µm to less than or equal to 1700 µm, greater than or equal to 650 µm to less than or equal to 1650 µm, greater than or equal to 700 µm to less than or equal to 1600 µm, greater than or equal to 750 µm to less than or equal to 1550 µm, greater than or equal to 800 µm to less than or equal to 1500 µm, greater than or equal to 850 µm to less than or equal to 1450 µm, greater than or equal to 900 µm to less than or equal to 1400 µm, greater than or equal to 950 µm to less than or equal to 1350 µm, greater than or equal to 1000 µm to less than or equal to 1300 µm, greater than or equal to 1050 µm to less than or equal to 1250 µm, greater than or equal to 1100 µm to less than or equal to 1200 µm, greater than or equal to 300 µm to less than or equal to 1150 µm, and any and all sub-ranges formed from any of these endpoints.

The polymer layer may have any appropriate thickness. The polymer layers are generally significantly thinner than the glass-based layers. In some embodiments, all of the polymer layers disposed between the glass-based layers in the glass-based articles may, individually, have a thickness of less than or equal to 150 µm. In embodiments, the first polymer layer may have a thickness $t_{P1}$ of less than or equal to 150 μm, such as less than or equal to 145 μm, less than or equal to 140 μm, less than or equal to 135 μm, less than or equal to 130 μm, less than or equal to 125 μm, less than or equal to 120 μm, less than or equal to 115 μm, less than or equal to 110 μm, less than or equal to 105 μm, less than or equal to 100 μm, less than or equal to 95 μm, less than or equal to 90 μm, less than or equal to 85 μm, less than or equal to 80 μm, less than or equal to 75 μm, less than or equal to 70 μm, less than or equal to 65 μm, less than or equal to 60 μm, less than or equal to 55 μm, less than or equal to 50 μm, less than or equal to 45 μm, less than or equal to 40 μm, less than or equal to 35 μm, less than or equal to 30 μm, less than or equal to 25 μm, less than or equal to 20 μm, less than or equal to 15 μm, less than or equal to 10 μm, less than or equal to 8 μm, less than or equal to 6 μm, less than or equal to 4 μm, less than or equal to 2 μm, less than or equal to 1 μm, or less. In embodiments, the first polymer layer may have a thickness $t_{P1}$ of from greater than or equal to 0.1 μm to less than or equal to 150 μm, such as from greater than or equal to 0.1 μm to less than or equal to 5 μm, from greater than or equal to 0.5 μm to less than or equal to 2 μm, from greater than or equal to 2 μm to less than or equal to 150 μm, from greater than or equal to 4 μm to less than or equal to 145 μm, from greater than or equal to 6 μm to less than or equal to 140 μm, from greater than or equal to 8 μm to less than or equal to 135 μm, from greater than or equal to 10 μm to less than or equal to 130 μm, from greater than or equal to 15 μm to less than or equal to 125 μm, from greater than or equal to 20 μm to less than or equal to 120 μm, from greater than or equal to 25 μm to less than or equal to 115 μm, from greater than or equal to 30 μm to less than or equal to 110 μm, from greater than or equal to 35 μm to less than or equal to 105 μm, from greater than or equal to 40 μm to less than or equal to 100 μm, from greater than or equal to 45 μm to less than or equal to 95 μm, from greater than or equal to 50 μm to less than or equal to 90 μm, from greater than or equal to 55 μm to less than or equal to 85 μm, from greater than or equal to 60 μm to less than or equal to 80 μm, from greater than or equal to 65 μm to less than or equal to 75 μm, from greater than or equal to 2 μm to less than or equal to 70 μm, and any and all sub-ranges formed from these endpoints. Where multiple polymer layers are included in the glass-based article, the polymer layers in the glass-based article may have different thicknesses. In other embodiments, where multiple polymer layers are included in the glass-based article the polymer layers may have substantially equivalent or equivalent thicknesses. In embodiments, the polymer layers may be thinner than the glass-based layers to which they are adjacent.

The glass-based articles may have any appropriate thickness. The thickness of the glass-based articles may be defined as the sum of the thickness of the layers included therein. For example, the thickness of the glass-based article may be equivalent to $t_{G1}+t_{G2}+t_{P1}$. In embodiments, the thickness of the glass-based article is less than or equal to 20 mm, such as less than or equal to 19 mm, less than or equal to 18 mm, less than or equal to 17 mm, less than or equal to 16 mm, less than or equal to 15 mm, less than or equal to 14 mm, less than or equal to 13 mm, less than or equal to 12 mm, less than or equal to 11 mm, less than or equal to 10 mm, less than or equal to 9 mm, less than or equal to 8 mm, less than or equal to 7 mm, less than or equal to 6 mm, less than or equal to 5 mm, less than or equal to 4 mm, less than or equal to 3 mm, less than or equal to 2 mm, less than or equal to 1.5 mm, less than or equal to 1 mm, or less. In embodiments, the thickness of the glass-based article is from greater than or equal to 0.5 mm to less than or equal to 20 mm, such as greater than or equal to 1 mm to less than or equal to 19 mm, greater than or equal to 2 mm to less than or equal to 18 mm, greater than or equal to 3 mm to less than or equal to 17 mm, greater than or equal to 4 mm to less than or equal to 16 mm, greater than or equal to 5 mm to less than or equal to 15 mm, greater than or equal to 6 mm to less than or equal to 14 mm, greater than or equal to 7 mm to less than or equal to 13 mm, greater than or equal to 8 mm to less than or equal to 12 mm, greater than or equal to 9 mm to less than or equal to 11 mm, greater than or equal to 0.5 mm to less than or equal to 10 mm, and any and all sub-ranges formed from these endpoints.

As described above, the first glass-base layer and the second glass-based layer have a coefficient of thermal expansion (CTE) mismatch. The difference in CTE between the first glass-based layer and the second glass-based layer is greater than 0.4 ppm/° C., such that $|CTE_{G1}-CTE_{G2}|>0.4$ ppm/° C. In embodiments, $|CTE_{G1}-CTE_{G2}|>0.5$ ppm/° C. or $|CTE_{G1}-CTE_{G2}|>1$ ppm/° C. In general, a greater mismatch in CTE of the glass-based layers produces greater amounts of compressive stress. In embodiments, $CTE_{G1}<CTE_{G2}$. In other embodiments, $CTE_{G1}>CTE_{G2}$. The glass-based layer with the higher CTE determines whether the curing of the polymer layer takes place above or below the usage temperature to produce a compressive stress in the first glass-based layer. In embodiments, where $CTE_{G1}<CTE_{G2}$ the curing temperature is greater than the usage temperature. In embodiments, where $CTE_{G1}>CTE_{G2}$ the curing temperature is lower than the usage temperature.

The relationship between the CTE of the polymer layer and the average CTE of the glass-based layers may also be considered. In embodiments, $CTE_{P1}-(CTE_{G1}+CTE_{G2})/2>1$ ppm/° C.

In embodiments, the glass-based articles include a third glass-based layer having a thickness $t_{G3}$ and a coefficient of thermal expansion $CTE_{G3}$; and a second polymer layer disposed between the second glass-based layer and the third glass-based layer having a thickness $t_{P2}$ and a coefficient of thermal expansion $CTE_{P2}$. The difference between $CTE_{G3}$ and $CTE_{G2}$ is greater than or equal to 0.4 ppm/° C., such as greater than or equal to 0.5 ppm/° C. The third glass-based layer includes a compressive stress. The inclusion of a third glass-based layer may allow for higher compressive stress to be achieved while also reducing or avoiding warp induced by the stress created in the glass-based articles. In embodiments, the first glass-based layer and the third glass-based layer have the same composition. In embodiments, the first polymer layer and the second polymer layer have the same composition. Additional glass-based layers and polymer layers may also be included.

The third glass-based layer may have the same thickness as the first glass-based layer, such that $t_{G1}=t_{G3}$. Alternatively, the third glass-based layer may have a different thickness than the first glass-based layer. In embodiments, the third glass-based layer has a thickness $t_{G3}$ of less than or equal to 300 μm, such as less than or equal to 200 μm, less than or equal to 190 μm, less than or equal to 180 μm, less than or equal to 170 μm, less than or equal to 160 μm, less than or equal to 150 μm, less than or equal to 140 μm, less than or equal to 130 μm, less than or equal to 120 μm, less than or equal to 110 μm, less than or equal to 100 μm, less than or equal to 90 μm, or less. In embodiments, the third glass-based layer has a thickness $t_{G3}$ of from greater than or equal to 90 μm to less than or equal to 300 μm, such as from greater than or equal to 90 μm to less than or equal to 200 μm, from greater than or equal to 100 μm to less than or equal to 190 μm, from greater than or equal to 110 μm to less than or equal to 180 μm, from greater than or equal to 120 μm to less than or equal to 170 μm, from greater than or equal to 130 μm to less than or equal to 160 μm, from greater than or equal to 140 μm to less than or equal to 150 μm, and any and all sub-ranges formed from any of these endpoints.

The second polymer layer may have the same thickness as the first polymer layer, such that $t_{P1}=t_{P2}$. Alternatively, the second polymer layer may have a different thickness than the first polymer layer. In embodiments, the second polymer layer may have a thickness $t_{P2}$ of less than or equal to 150 μm, such as less than or equal to 145 μm, less than or equal to 140 μm, less than or equal to 135 μm, less than or equal to 130 μm, less than or equal to 125 μm, less than or equal to 120 μm, less than or equal to 115 μm, less than or equal to 110 μm, less than or equal to 105 μm, less than or equal to 100 μm, less than or equal to 95 μm, less than or equal to 90 μm, less than or equal to 85 μm, less than or equal to 80 μm, less than or equal to 75 μm, less than or equal to 70 μm, less than or equal to 65 μm, less than or equal to 60 μm, less than or equal to 55 μm, less than or equal to 50 μm, less than or equal to 45 μm, less than or equal to 40 μm, less than or equal to 35 μm, less than or equal to 30 μm, less than or equal to 25 μm, less than or equal to 20 μm, less than or equal to 15 μm, less than or equal to 10 μm, less than or equal to 8 μm, less than or equal to 6 μm, less than or equal to 4 μm, less than or equal to 2 μm, less than or equal to 1 μm, or less. In embodiments, the second polymer layer may have a thickness $t_{P2}$ of from greater than or equal to 0.1 μm to less than or equal to 150 μm, such as from greater than or equal to 0.1 μm to less than or equal to 5 μm, from greater than or equal to 0.5 μm to less than or equal to 2 μm, from greater than or equal to 2 μm to less than or equal to 150 μm, from greater than or equal to 4 μm to less than or equal to 145 μm, from greater than or equal to 6 μm to less than or equal to 140 μm, from greater than or equal to 8 μm to less than or equal to 135 μm, from greater than or equal to 10 μm to less than or equal to 130 μm, from greater than or equal to 15 μm to less than or equal to 125 μm, from greater than or equal to 20 μm to less than or equal to 120 μm, from greater than or equal to 25 μm to less than or equal to 115 μm, from greater than or equal to 30 μm to less than or equal to 110 μm, from greater than or equal to 35 μm to less than or equal to 105 μm, from greater than or equal to 40 μm to less than or equal to 100 μm, from greater than or equal to 45 μm to less than or equal to 95 μm, from greater than or equal to 50 μm to less than or equal to 90 μm, from greater than or equal to 55 μm to less than or equal to 85 μm, from greater than or equal to 60 μm to less than or equal to 80 μm, from greater than or equal to 65 μm to less than or equal to 75 μm, from greater than or equal to 2 μm to less than or equal to 70 μm, and any and all sub-ranges formed from these endpoints.

The first glass-based layer includes a compressive stress. The compressive stress improves the resistance of the glass-based articles to fracture and reduces crack propagation. In embodiments, the first glass-based layer includes a compressive stress greater than or equal to 5 MPa, such as greater than or equal to 10 MPa, greater than or equal to 15 MPa, greater than or equal to 20 MPa, greater than or equal to 25 MPa, greater than or equal to 30 MPa, greater than or equal to 35 MPa, greater than or equal to 40 MPa, greater than or equal to 45 MPa, greater than or equal to 50 MPa, greater than or equal to 55 MPa, greater than or equal to 60 MPa, greater than or equal to 65 MPa, greater than or equal to 70 MPa, greater than or equal to 75 MPa, greater than or equal to 80 MPa, greater than or equal to 85 MPa, greater than or equal to 90 MPa, greater than or equal to 95 MPa, greater than or equal to 100 MPa, or more. In embodiments, the first glass-based layer includes a compressive stress from greater than or equal to 5 MPa to less than or equal to 100 MPa, such as greater than or equal to 10 MPa to less than or equal to 95 MPa, greater than or equal to 15 MPa to less than or equal to 90 MPa, greater than or equal to 20 MPa to less than or equal to 85 MPa, greater than or equal to 25 MPa to less than or equal to 80 MPa, greater than or equal to 30 MPa to less than or equal to 75 MPa, greater than or equal to 35 MPa to less than or equal to 70 MPa, greater than or equal to 40 MPa to less than or equal to 65 MPa, greater than or equal to 45 MPa to less than or equal to 60 MPa, greater than or equal to 50 MPa to less than or equal to 55 MPa, and any and all sub-ranges formed from these endpoints. Unless otherwise indicated, the compressive stress is measured with a scattered light polariscope (SCALP).

The first glass-based layer may include a substantially uniform compressive stress. In embodiments, the first glass-based layer comprises an average compressive stress and the compressive stress varies over the thickness of the first glass-based layer by less than 20% of the average compressive stress. In such embodiments, the average compressive stress of the first glass-based layer may be any of the compressive stress values described above, such as greater than or equal to 5 MPa, greater than or equal to 10 MPa, etc.

The first glass-based layer may be characterized by an exposed surface compressive stress. The surface of the first glass-based layer that is not in contact with the polymer layer is the exposed surface and is the surface that may be contacted by a user and most likely to suffer damage in the course of normal use. In embodiments, the exposed surface of the first glass-based layer has a compressive stress that may be any of the compressive stress values described above, such as greater than or equal to 5 MPa, greater than or equal to 10 MPa, etc.

The first glass-based layer may be characterized by a bonded surface compressive stress. The surface of the first glass-based layer that is contact with the polymer layer is the bonded surface. In embodiments, the bonded surface of the first glass-based layer has a compressive stress that may be any of the compressive stress values described above, such as greater than or equal to 5 MPa, greater than or equal to 10 MPa, etc. In embodiments where the compressive stress in the first glass-based layer is substantially uniform, the exposed surface compressive stress may be substantially equal to the bonded surface compressive stress.

The first glass-based layer may be formed from a chemically strengthened glass-based material. Chemically strengthened glass-based materials include a stress profile that is additively combined with the compressive stress produced by the CTE mismatch of the glass-based layers, resulting in a maximum compressive stress in the first glass-based layer that may be significantly higher than the compressive stress due to the CTE mismatch alone. In embodiments, the first glass-based layer includes a compressive stress greater than or equal to 200 MPa, such as greater than or equal to 250 MPa, greater than or equal to 300 MPa, greater than or equal to 350 MPa, greater than or equal to 400 MPa, greater than or equal to 450 MPa, greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, or more. In embodiments, the first glass-based layer includes a compressive stress from greater than or equal to 200 MPa to less than or equal to 1000 MPa, such as greater than or equal to 250 MPa to less than or equal to 950 MPa, greater than or equal to 300 MPa to less than or equal to 900 MPa, greater than or equal to 350 MPa to less than or equal to 850 MPa, greater than or equal to 400 MPa to less than or equal to 800 MPa, greater than or equal to 450 MPa to less than or equal to 750 MPa, greater than or equal to 500 MPa to less than or equal to 700 MPa, greater than or equal to 550 MPa to less than or equal to 650 MPa, greater than or equal to 200 MPa to less than or equal to 600 MPa, and any and all sub-ranges formed from these endpoints.

In embodiments that include a third glass-based layer, the third glass-based layer may be characterized by the same compressive stress features as described with respect to the first glass-based layer above. In embodiments, the third glass-based layer includes a compressive stress substantially equivalent to the compressive stress of the first glass-based layer.

The second glass-based layer may be formed from a chemically strengthened glass-based material. Chemically strengthened glass-based materials include a stress profile that is additively combined with the compressive stress produced by the CTE mismatch of the glass-based layers, resulting in a stress in the second glass-based layer that may be significantly different than the stress due to the CTE mismatch alone. In embodiments, the second glass-based layer includes a compressive stress greater than or equal to 200 MPa, such as greater than or equal to 250 MPa, greater than or equal to 300 MPa, greater than or equal to 350 MPa, greater than or equal to 400 MPa, greater than or equal to 450 MPa, greater than or equal to 500 MPa, greater than or equal to 550 MPa, greater than or equal to 600 MPa, greater than or equal to 650 MPa, greater than or equal to 700 MPa, greater than or equal to 750 MPa, greater than or equal to 800 MPa, greater than or equal to 850 MPa, greater than or equal to 900 MPa, greater than or equal to 950 MPa, or more. In embodiments, the second glass-based layer includes a compressive stress from greater than or equal to 200 MPa to less than or equal to 1000 MPa, such as greater than or equal to 250 MPa to less than or equal to 950 MPa, greater than or equal to 300 MPa to less than or equal to 900 MPa, greater than or equal to 350 MPa to less than or equal to 850 MPa, greater than or equal to 400 MPa to less than or equal to 800 MPa, greater than or equal to 450 MPa to less than or equal to 750 MPa, greater than or equal to 500 MPa to less than or equal to 700 MPa, greater than or equal to 550 MPa to less than or equal to 650 MPa, greater than or equal to 200 MPa to less than or equal to 600 MPa, and any and all sub-ranges formed from these endpoints.

The second glass-based layer may be characterized by Young's modulus. In embodiments, the second glass-based layer may have a Young's modulus $E_{G2}$ greater than or equal to 5 GPa, such as greater than or equal to 10 GPa, greater than or equal to 15 GPa, greater than or equal to 20 GPa, greater than or equal to 25 GPa, greater than or equal to 30 GPa, greater than or equal to 35 GPa, greater than or equal to 40 GPa, greater than or equal to 45 GPa, greater than or equal to 50 GPa, greater than or equal to 55 GPa, greater than or equal to 60 GPa, greater than or equal to 65 GPa, greater than or equal to 70 GPa, greater than or equal to 75 GPa, or more. In embodiments, $E_{G2}$ is from greater than or equal to 5 GPa to less than or equal to 80 GPa, such as greater than or equal to 10 GPa to less than or equal to 75 GPa, greater than or equal to 15 GPa to less than or equal to 70 GPa, greater than or equal to 20 GPa to less than or equal to 65 GPa, greater than or equal to 25 GPa to less than or equal to 60 GPa, greater than or equal to 30 GPa to less than or equal to 55 GPa, greater than or equal to 35 GPa to less than or equal to 50 GPa, greater than or equal to 40 GPa to less than or equal to 45 GPa, and any and all sub-ranges formed from these endpoints. Unless otherwise indicated, the Young's modulus of glass-based layers are measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

The Young's modulus of the second glass-based layer $E_{G2}$ may be described in relation to the Young's modulus of the first polymer layer $E_{P1}$. In embodiments, the Young's modulus of the second glass-based layer is greater than the Young's modulus of the first polymer layer, such that $E_{G2} > E_{P1}$.

The glass-based layers may include glass or glass ceramic materials. The first glass-based layer and the second glass-based layer have different compositions. The glass-based layers may be an aluminosilicate glass, such as an aluminosilicate glass, an aluminoborosilicate glass, a soda-lime glass. In embodiments, the first glass-based layer is an aluminoborosilicate glass, such as an alkali-free aluminoborosilicate glass. In embodiments, the second glass-based layer is an aluminosilicate glass, an alkali aluminosilicate glass, or a soda-lime glass.

The glass-based layers, especially the first glass-based layer, may be selected to provide a high resistance to scratch damage. In embodiments, the first glass-based layer may have a Knoop scratch threshold of greater than or equal to 6 N, such as greater than or equal to 6 N, greater than or equal to 7 N, greater than or equal to 8 N, greater than or equal to 9 N, greater than or equal to 10 N, greater than or equal to 11 N, greater than or equal to 12 N, greater than or equal to 13 N, greater than or equal to 14 N, greater than or equal to 15 N, greater than or equal to 16 N, or more. The scratch resistance of the first glass-based layer may be higher than the scratch resistance of ion exchange strengthened glass articles previously employed in applications for which the glass-based articles described herein are useful.

The glass-based layers may be selected to provide desirable optical properties. In embodiments, the glass-based layers have a transmission of greater than or equal to 90% over the wavelength range of 400 nm to 750 nm, such as greater than or equal to 91%, greater than or equal to 92%, greater than or equal to 93%, greater than or equal to 94%, greater than or equal to 95%, greater than or equal to 96%, greater than or equal to 97%, greater than or equal to 98%, greater than or equal to 99%, or more. Unless otherwise indicated, transmission is measured with a Haze-gard Transparency Transmission Haze Meter, according to ASTM D1003 using Illuminant C.

In embodiments, the glass-based layers of the glass-based article may have a composition including: about 50 mol % to about 85 mol % $SiO_2$, about 5 mol % to about 30 mol % $Al_2O_3$, and about 5 mol % to about 30 mol % $B_2O_3$. The glass-based layer may include glass compositions produced in accordance with U.S. Pat. Nos. 7,851,394 and/or 7,534,734, each of which are incorporated herein by reference in their entirety.

In embodiments, the glass-based layers may be alkali aluminosilicate compositions, such as those commonly subjected to ion exchange strengthening processes and used in mobile electronic device. The alkali aluminosilicate glasses may be used in the glass-based articles in ion exchanged or non-ion exchanged form. In embodiments, the alkali aluminosilicate glass-based layers may be substantially free or free of lithium. The glass-based layer may include glass compositions in accordance with U.S. Patent App. Pub. No. 2013/0122284 A1, published May 16, 2013, which is incorporated herein by reference in its entirety.

The polymer layer may be formed from any appropriate polymer material. In embodiments, the polymer layer may include a resin, such as an optically clear resin. The polymer layer may be commercially available, such as resins commonly utilized to repair windshields. In embodiments, the polymer layer may include an ultraviolet curable resin or a heat curable resin. In embodiments, the polymer layer may include an epoxy or an acrylate. The polymer layers may also include photoinitiators to provide the desired curing behavior. Where multiple polymer layers are included in the glass-based article, the polymer layers in the glass-based article may be formed from the same material. In other embodiments, where multiple polymer layers are included in the glass-based article the polymer layers may be formed from different materials. It should be generally understood that any properties described herein with reference to the first polymer layer may also be ascribed to any other polymer layers included in the glass-based articles.

The polymer layers may be characterized on the basis of the glass transition temperature. The glass transition temperature influences the compressive stress produced as a result of the CTE mismatch of the glass-based layers. In embodiments, the first polymer layer has a glass transition temperature $T_{gP1}$ greater than or equal to 20° C., such as greater than or equal to 30° C., greater than or equal to 40° C., greater than or equal to 50° C., greater than or equal to 60° C., greater than or equal to 70° C., greater than or equal to 80° C., greater than or equal to 90° C., greater than or equal to 100° C., greater than or equal to 110° C., greater than or equal to 120° C., greater than or equal to 130° C., greater than or equal to 140° C., greater than or equal to 150° C., or more. In embodiments, the first polymer layer has a glass transition temperature $T_{gP1}$ from greater than or equal to 20° C. to less than or equal to 200° C., such as greater than or equal to 30° C. to less than or equal to 190° C., greater than or equal to 40° C. to less than or equal to 180° C., greater than or equal to 50° C. to less than or equal to 170° C., greater than or equal to 60° C. to less than or equal to 160° C., greater than or equal to 70° C. to less than or equal to 150° C., greater than or equal to 80° C. to less than or equal to 140° C., greater than or equal to 90° C. to less than or equal to 130° C., greater than or equal to 100° C. to less than or equal to 120° C., greater than or equal to 20° C. to less than or equal to 110° C., and any and all sub-ranges formed from these endpoints. Unless otherwise indicated, the glass transition temperature of the polymer is measured by dynamic mechanical analysis.

The polymer layer may also be characterized based on the storage modulus. In embodiments, the storage modulus of the first polymer layer at temperatures between 0° C. and 40° C. is greater than or equal to 5 MPa and less than or equal to 20,000 MPa, such as greater than or equal to 2,000 MPa and less than or equal to 5,000 MPa, and any and all sub-ranges formed from these endpoints.

The polymer layer may be characterized based on the deformation behavior at the usage temperature, such as room temperature, of the glass-based article. In embodiments, the first polymer layer does not exhibit brittle deformation behavior at 20° C. Stated differently, the polymer layer may exhibit ductile deformation behavior at 20° C. The non-brittle deformation behavior of the polymer layer prevents cracks from extending from one glass-based layer through the polymer layer to another glass-based layer, also referred to as arresting the cracks.

The polymer layers may have optical properties that are compatible with the glass-based layers. In embodiments, the polymer layer may have a transmission of greater than or equal to 90% over the wavelength range of 400 nm to 750 nm, such as greater than or equal to 91%, greater than or equal to 92%, greater than or equal to 93%, greater than or equal to 94%, greater than or equal to 95%, greater than or equal to 96%, greater than or equal to 97%, greater than or equal to 98%, greater than or equal to 99%, or more.

The polymer layers may be relatively stiff, such as a polymer with an elastic modulus greater than or equal to 100 MPa at a strain rate of 1/s. The stiffness of the polymer layer material may constrain the glass-based layers, preventing the growth of cracks in the glass-based layers and prevent the glass-based layer from flexing and breaking. The polymer layer may have an elastic modulus greater than or equal to 100 MPa at a strain rate of 1/s, such as greater than or equal to 105 MPa, greater than or equal to 110 MPa, greater than or equal to 115 MPa, greater than or equal to 120 MPa, greater than or equal to 125 MPa, or more. In embodiments, the stiffness of the polymer layer may be related to the thickness of the polymer layer, such that the elastic modulus of the polymer layer divided by the thickness of the polymer layer is greater than or equal to 1 MPa/μm, such as greater than or equal to 2 MPa/μm, greater than or equal to 3 MPa/μm, greater than or equal to 4 MPa/μm, greater than or equal to 5 MPa/μm, greater than or equal to 6 MPa/μm, greater than or equal to 7 MPa/μm, greater than or equal to 8 MPa/μm, greater than or equal to 9 MPa/μm, greater than or equal to 10 MPa/μm, or more. Unless otherwise indicated, the elastic modulus of the polymer is measured by dynamic mechanical analysis.

The polymer layers may be resistant to fracture. In embodiments, the polymer layers have a fracture toughness greater than or equal to 0.8 MPa m, such as greater than or equal to 0.81 MPa m, greater than or equal to 0.82 MPa m, greater than or equal to 0.83 MPa m, greater than or equal to 0.84 MPa m, greater than or equal to 0.85 MPa m, or more.

The polymer layers may be characterized on the basis of volume change as a function of temperature. This phenomenon is commonly referred to as shrinkage. The polymer may also exhibit shrinkage as a result of the curing process. In embodiments, the polymer undergoes a shrinkage of greater than or equal to 1% during the curing process, such as greater than or equal to 2%, greater than or equal to 3%, or more.

The polymer layers may include additional components to alter the properties thereof. In embodiments, the polymer layers may include carbon nanotubes, such as multi-walled carbon nanotubes. The inclusion of carbon nanotubes in the polymer layers may increase the resistance of the glass-based articles to fracture, such as indicated by a ball drop test. Without being bound by any particular theory, the inclusion of carbon nanotubes in the polymer increases the storage modulus, Young's modulus, and tensile strength of the polymer layer producing the improved crack resistance. In embodiments, the polymer layers may include carbon nanotubes in an amount of about 1%.

The polymer layers may also include colorants. The inclusion of colorants in the polymer layer may impart a pleasing aesthetic appearance to the glass-based article as a whole without degrading the mechanical properties thereof. In embodiments, the polymer layer may include a colorant in the amount of greater than or equal to 0.1 wt % to less than or equal to 30 wt %. The colorant may be selected for compatibility with the composition of the polymer layer. For example, epoxy-based colorants may be employed when the polymer layer is an epoxy. For example, in the case of epoxy adhesives one can dope epoxy-based colorants such as Epoxicolor® series from Specialty Polymers & Services into the epoxy precursor mix at ranges of 0.1-30% by weight. Similarly, Orcozinedyes and OrcoTint NS dyes from Orco (Organic Dyes and Pigments) can also be used for acrylate-based adhesives.

The glass-based articles described herein may appear transparent and colorless. In embodiments, the glass-based articles may have a transmission of greater than or equal to 90% over the wavelength range of 400 nm to 750 nm., such as greater than or equal to 91%, greater than or equal to 92%, greater than or equal to 93%, greater than or equal to 94%, greater than or equal to 95%, greater than or equal to 96%, greater than or equal to 97%, greater than or equal to 98%, greater than or equal to 99%, or more.

The glass-based articles may have any appropriate geometry. In embodiments, the glass-based articles are substantially flat or planar. In some embodiments, the glass-based articles may include openings or notches, such as openings to accommodate cameras, speakers, microphones, or fingerprint sensors.

The glass-based articles may be produced by any appropriate lamination process. In general, the glass-based articles are produced by disposing a polymer layer between glass-based layers, and then curing the polymer layer in an environment at a temperature that is different than the intended usage temperature. Where more than two glass-based layers are to be included in the glass-based articles, the disposing step may be repeated for each additional glass-based layer to be added to form a laminate stack. In embodiments where more than one polymer layer is present, all of the polymer layers may be cured concurrently.

The glass-based article may be cut or machined to a desired geometry after lamination and curing of the polymer layer. This allows large sheets of the glass-based articles to be formed and subsequently cut to the desired part size, increasing manufacturing efficiency and flexibility. After cutting the glass-based articles into the desired part size, edge finishing processes may be utilized to reduce the flaw population on the cut edges and produce an edge profile that is less susceptible to failure when the glass-based article is subjected to bending stresses. In embodiments, the glass-based layers may be cut and machined to a desired final geometry before assembly and curing of the laminate stack.

The disposition of the polymer layer may be carried out with any method capable of producing a polymer layer with the desired thickness. In embodiments, the polymer layer may be disposed using a doctor blade, roller, spray system, or any other technique known in the art. In embodiments, the polymer layers are disposed using flexographic or gravure printing techniques. Selecting appropriate disposition techniques allows the thickness of the polymer layer to be uniformly controlled. In embodiments, flexographic or gravure printing techniques are employed to produce a polymer layer with a thickness variation of less than or equal to 3 μm. The polymer layers may be formed from a liquid adhesive composition. In embodiments, the polymer layer may be deposited as a pre-formed film. After the polymer layer is disposed between the glass-based layers, pressure may be applied to the glass-based layers to remove any air bubbles or excess polymer from the laminate.

The curing of the polymer layer occurs in an environment at a curing temperature $T_C$, where the curing temperature is different than the intended usage temperature (such as room temperature). After the polymer layer is cured the glass-based article is returned to the intended usage temperature, and the difference in CTE between the glass-based layers produces a compressive stress in the glass-based article, such as in the first glass-based layer.

In embodiments, the difference between $T_C$ and room temperature ($|T_C-20°$ C.$|$) is greater than or equal to 10° C., such as greater than or equal to 15° C., greater than or equal to 20° C., greater than or equal to 25° C., greater than or equal to 30° C., greater than or equal to 35° C., greater than or equal to 40° C., greater than or equal to 45° C., greater than or equal to 50° C., greater than or equal to 55° C., greater than or equal to 60° C., greater than or equal to 65° C., greater than or equal to 70° C., greater than or equal to 75° C., greater than or equal to 80° C., greater than or equal to 85° C., greater than or equal to 90° C., greater than or equal to 95° C., greater than or equal to 100° C., greater than or equal to 105° C., greater than or equal to 110° C., greater than or equal to 115° C., greater than or equal to 120° C., or more. The laminate may be held in the curing temperature environment for a period of time prior to curing the polymer, which may be referred to as pre-heating. This allows the laminate to substantially equilibrate to the curing temperature. In embodiments, the laminate may be maintained in the curing temperature environment for greater than or equal to 2 minutes, such as greater than or equal to 3 minutes, greater than or equal to 4 minutes, greater than or equal to 5 minutes, greater than or equal to 6 minutes, greater than or equal to 7 minutes, greater than or equal to 8 minutes, greater than or equal to 9 minutes, greater than or equal to 10 minutes, or more.

The ultraviolet irradiation for curing the polymer layer may extend for any time period sufficient to produce the desired level of curing. In embodiments, the UV irradiation extends for a time period of greater than or equal to 0.5 min, such as greater than or equal to 1 min, greater than or equal to 2 min, greater than or equal to 3 min, greater than or equal to 4 min, greater than or equal to 5 min, greater than or equal to 6 min, greater than or equal to 7 min, greater than or equal to 8 min, greater than or equal to 9 min, greater than or equal to 10 min, or more.

The curing may take place in any environment capable of maintaining the desired curing temperature and accommodating the glass-based articles. In embodiments, the curing takes place in an oven, furnace, refrigerator, freezer, or other environmental chamber.

The curing temperature may be above or below the intended usage temperature, with the relative CTE values of the glass-based layers selected accordingly to produce a compressive stress in the exposed glass-based layers, such as the first glass-based layer. In embodiments, $T_C$ is greater than or equal to 30° C. and $CTE_{G2}>CTE_{G1}$. In embodiments, $T_C$ is less than or equal to 0° C. and $CTE_{G1}>CTE_{G2}$.

The curing temperature may also be selected based on the glass transition temperature of the polymer layer. In embodiments, the curing temperature is great than or equal to 10° C. more than the glass transition temperature of the polymer layer ($T_C>T_{gP1}+10°$ C.).

The glass-based articles may be subjected to an additional ultraviolet irradiation after returning to the usage temperature, such as room temperature. The additional ultraviolet irradiation ensures that the polymer layer is completely cured. In embodiments, the additional UV irradiation extends for a period of greater than or equal to 1 min, such as greater than or equal to 2 min, greater than or equal to 3 min, greater than or equal to 4 min, greater than or equal to 5 min, greater than or equal to 6 min, greater than or equal to 7 min, greater than or equal to 8 min, greater than or equal to 9 min, greater than or equal to 10 min, or more.

In embodiments, the polymer layer may be cured by irradiating the polymer layer with ultraviolet radiation. In embodiments, the polymer layer may be cured by heat treating the polymer layer, such as by heating the laminate as a whole or by locally heating the polymer layer. For example, the laminate may be placed in an oven, in a furnace, or on a hot plate to heat treat and cure the polymer layer. In some embodiments, a combination of ultraviolet radiation and heat treatment may be employed to cure the polymer layer.

The process of producing the glass-based articles may include a heat treatment step after curing the polymer layer. In embodiments, the glass-based article is heated to a temperature greater than or equal to 40° C. after the polymer layer is cured. This additional heat treatment may assist in further curing the polymer layer.

EXAMPLES

The embodiments described herein will be further clarified by the following examples.

The glass-based articles were formed with glass layers having the compositions in Table I, with the composition provided in mol %.

TABLE I

| Composition | A | B |
|---|---|---|
| $SiO_2$ | 57.83 | 67.65 |
| $Al_2O_3$ | 16.53 | 10.99 |
| $B_2O_3$ | | 9.76 |
| $P_2O_5$ | 6.45 | |
| $Na_2O$ | 16.51 | |

TABLE I-continued

| Composition | A | B |
|---|---|---|
| MgO | 2.55 | 2.28 |
| CaO | 0.05 | 8.73 |
| SrO | | 0.52 |
| $SnO_2$ | 0.05 | |
| Poisson's Ratio | 0.219 | 0.230 |
| E (GPa) | 65.8 | 73.6 |

Laminated glass-based articles were prepared by cutting glass layers to a desired geometry and disposing a polymer between the glass layers. The samples included two or three glass layers with a polymer layer disposed between each of the glass layers, such that a laminate with two glass layers has a single polymer layer and a laminate with three glass layers has two polymer layers. The glass layers had compositions as described in Table I. The polymer layers were formed from commercially available UltraBond 45 (UB45), UltraBond 20 (UB20), UltraBond 400 (UB400), and Ultra-Bond 2400 (UB2400) UV-curable resins. The laminate stack was irradiated with ultraviolet light from a commercially available lamp to cure the resin. The UV exposure occurred at an elevated curing temperature $T_C$ and/or at room temperature of 20° C. The details of the prepared samples are reported in Table II.

In Table II, where no data is reported for the 3rd glass layer no $3^{rd}$ glass layer was included. Where no Tc is reported, the laminate was not cured at a temperature other than room temperature (20° C.). Pre-heat time refers to the time for which the laminate was held at the curing temperature prior to UV irradiation. The cure time at Tc indicates the amount of time for which the UV irradiation occurred while the laminate was in the environment at the curing temperature. The cure time at 20° C. indicates the amount of time for which the UV irradiation was conducted at room temperature.

TABLE II

| | 1st Glass Layer | | 2nd Glass Layer | | 3rd Glass Layer | | Polymer | |
|---|---|---|---|---|---|---|---|---|
| Sample | Comp. | t (μm) | Comp. | t (μm) | Comp. | t (μm) | Comp. | t (μm) |
| 1 | B | 100 | A | 550 | | | UB45 | 32.4 |
| 2 | B | 100 | A | 550 | | | UB45 | 122.4 |
| 3 | B | 100 | A | 700 | | | UB45 | 51.2 |
| 4 | B | 100 | A | 700 | | | UB45 | 91.2 |
| 5 | B | 100 | A | 700 | | | UB45 | 15.4 |
| 6 | B | 100 | A | 700 | | | UB45 | 113.8 |
| 7 | B | 100 | A | 550 | B | 100 | UB45 | 38.4 |
| 8 | B | 100 | A | 700 | | | UB45 | 18.6 |
| 9 | B | 100 | A | 550 | B | 100 | UB45 | 57.4 |
| 10 | B | 100 | A | 700 | B | 100 | UB45 | 36.0 |
| 11 | B | 100 | A | 700 | B | 100 | UB45 | 28.4 |
| 12 | B | 100 | A | 700 | | | UB45 | 49.6 |
| 13 | B | 100 | A | 700 | | | UB45 | 23.6 |
| 14 | B | 100 | A | 700 | | | UB45 | 21.2 |
| 15 | B | 100 | A | 550 | B | 100 | UB45 | 36.6 |
| 16 | B | 100 | A | 550 | B | 100 | UB45 | 9.2 |
| 17 | B | 100 | A | 550 | B | 100 | UB45 | 10.4 |
| 18 | B | 100 | A | 550 | B | 100 | UB45 | 35.2 |
| 19 | B | 100 | A | 550 | B | 100 | UB45 | 35.2 |
| 20 | B | 100 | A | 550 | B | 100 | UB45 | 37.6 |
| 21 | B | 100 | A | 550 | B | 100 | UB45 | 16.2 |
| 22 | B | 100 | A | 550 | B | 100 | UB20 | 70.4 |
| 23 | B | 100 | A | 550 | B | 100 | UB45 | 130.2 |
| 24 | B | 100 | A | 550 | B | 100 | UB400 | 220.2 |
| 25 | B | 100 | A | 550 | B | 100 | UB2400 | 204.8 |
| 26 | B | 100 | A | 550 | B | 100 | UB45 | 31.5 |
| 27 | B | 100 | A | 550 | B | 100 | UB45 | 26.8 |

TABLE II-continued

| 28 | B | 100 | A | 550 | B | 100 | UB45 | 39.8 |
| 29 | B | 100 | A | 550 | B | 100 | UB20 | 51.0 |
| 30 | B | 100 | A | 550 | B | 100 | UB20 | 81.8 |

| Sample | $T_C$ (° C.) | Pre-Heat Time (min) | Cure Time at $T_C$ (min) | Cure Time at 20° C. (min) | Crack Length (μm) |
|---|---|---|---|---|---|
| 1 | | | | 1 | 6918 |
| 2 | | | | 1 | 9218 |
| 3 | | | | 1 | 7654 |
| 4 | | | | 1 | 6246 |
| 5 | 100 | 2 | 0.5 | 1 | 3609 |
| 6 | 100 | 2 | 0.5 | 1 | 7030 |
| 7 | 100 | 2 | 0.5 | 1 | 4573 |
| 8 | 100 | 2 | 0.5 | 1 | 6984 |
| 9 | 100 | 2 | 0.5 | 1 | 4701 |
| 10 | 100 | 4 | 0.5 | 1 | 3802 |
| 11 | 100 | 8 | 0.5 | 1 | 4016 |
| 12 | 22 | 8 | 1 | 1 | 6197 |
| 13 | 90 | 8 | 1 | 1 | 3862 |
| 14 | 170 | 8 | 1 | 1 | 3281 |
| 15 | | | | 1 | 6544 |
| 16 | 60 | 8 | 1 | 1 | 4002 |
| 17 | 90 | 8 | 1 | 1 | 3868 |
| 18 | 133 | 8 | 1 | 1 | 3363 |
| 19 | 170 | 8 | 1 | 1 | 4117 |
| 20 | 93 | 8 | 1 | 1 | 3600 |
| 21 | 95 | 8 | 1 | 1 | 3301 |
| 22 | | | | 2 | 6055 |
| 23 | | | | 2 | 5742 |
| 24 | | | | 2 | 6678 |
| 25 | | | | 2 | 6845 |
| 26 | 98 | 4 | 2 | | 4100 |
| 27 | 98 | 4 | 2 | | 3641 |
| 28 | 98 | 4 | 2 | | 4111 |
| 29 | | | 8 | 2 | 5277 |
| 30 | | | 8 | 2 | 5198 |

The average crack length reported in Table II was measured as the maximum crack length after dropping a ball onto the cured glass-based articles from a height of 75 mm, with the 1 st glass layer in contact with 120 grit sandpaper.

Figure 5:
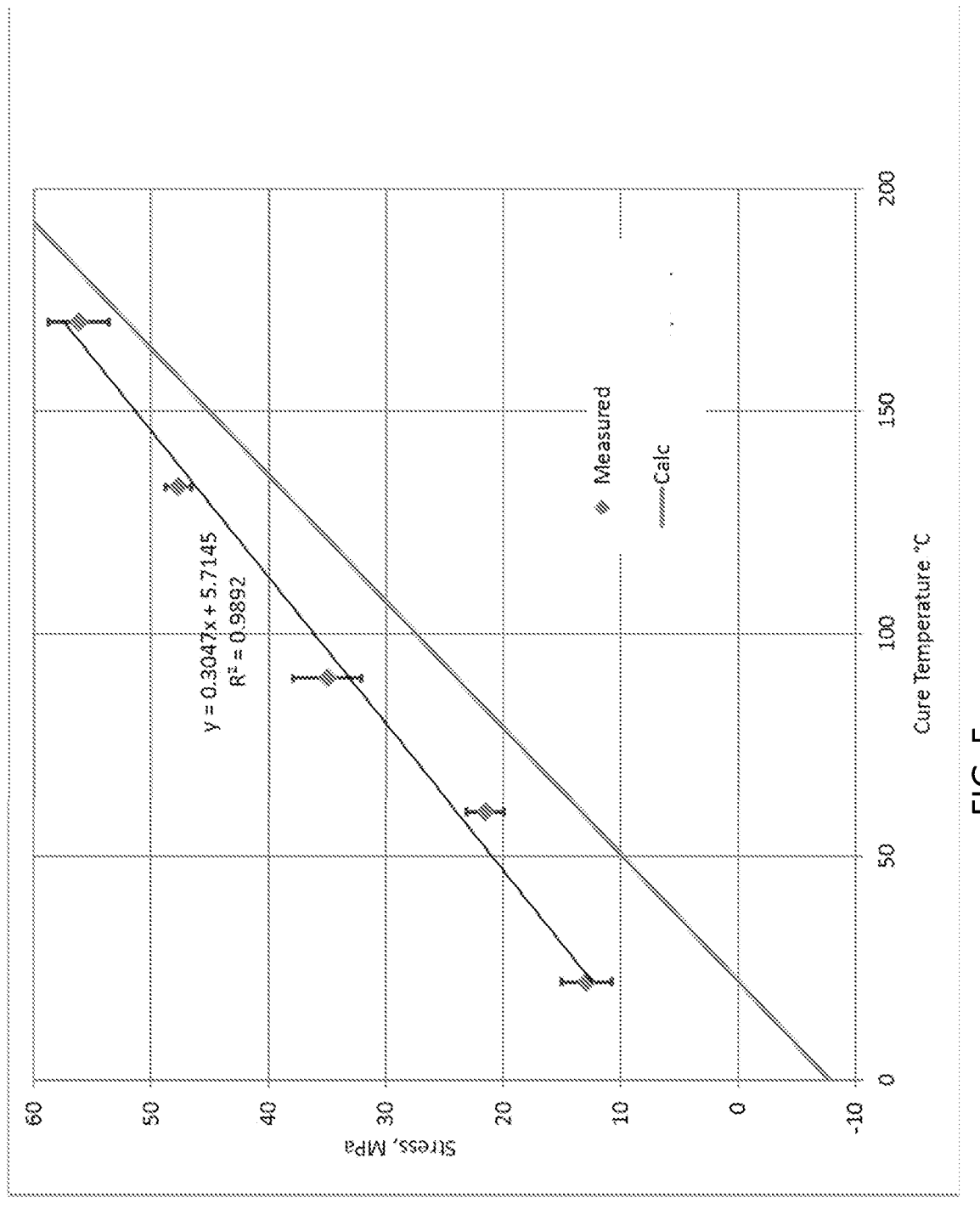
FIG. 5 is a plot of stress as a function of cure temperature for a glass-based article according to embodiments.

The compressive stress for Examples 16-19 in Table II was measured. As shown in FIG. 5, the measured compressive stress was higher than calculated based on the difference in CTE of the glass layers alone for all cure temperatures. This additional stress is attributable to the shrinkage polymer which imparts a compressive stress to the glass layers.

Polymer compositions were created form commercially available components. The commercially available components include: Ebecryl 3605, a partially acrylated epoxy resin; Ebecryl 270, an aliphatic urethane diacrylate oligomer; Irgacure 2022, a free radical photoinitiator; CD-1012, a cationic photoinitiator; Elvacite 2028, a passive methyl methacrylate resin; Elvacite 4026, a passive butyl methacrylate resin; and Elvacite 4056, an acrylated methyl methacrylate acrylic resin. The polymer compositions are reported in Table III, with the amounts of the components provided in wt %.

TABLE III

| Polymer Composition | 37 | 57 | 67-2 | 67-3 | 67-4 | 75-1 | 75-2 | 76-1 |
|---|---|---|---|---|---|---|---|---|
| Isobornyl acrylate | 45.20 | 41.11 | 45.12 | 52.29 | 52.29 | 37.87 | 37.87 | 37.87 |
| Acrylic acid | | 9.04 | | | | | | |
| Ebecryl 3605 | 10.21 | 9.28 | 7.16 | 7.29 | 7.29 | 8.55 | 8.55 | 8.55 |
| Ebecryl 270 | 42.35 | 38.52 | 29.72 | 30.25 | 30.25 | 35.48 | 35.48 | 35.48 |
| Irgacure 2022 | 1.69 | 1.54 | 1.18 | 1.21 | 1.21 | 1.41 | 1.41 | 1.41 |
| CD-1012 | 0.55 | 0.51 | 0.40 | 0.40 | 0.40 | 0.48 | 0.48 | 0.48 |
| Elvacite 2028 | | | | 8.56 | | 16.21 | | |
| Elvacite 4026 | | 6.46 | | | | | 16.21 | |
| Elvacite 4056 | | | | | 8.56 | | | 16.21 |

TABLE III-continued

| | 76-2 | 67-A | 67-B | 67-C | 67-3 | 67-D | 67-E |
|---|---|---|---|---|---|---|---|
| Crack Length (μm) | 3202 | | 3154 | 3346 | | 4511 | 3963 | 4215 |
| Approximate Thickness (um) | 15 | | 24 | 31 | | 13 | 12 | 12 |

| Polymer Composition | 76-2 | 67-A | 67-B | 67-C | 67-3 | 67-D | 67-E |
|---|---|---|---|---|---|---|---|
| Isobornyl acrylate | 54.08 | 10.00 | 75.00 | 55.96 | 52.29 | 59.98 | 60.85 |
| Acrylic acid | | | | | | | |
| Ebecryl 3605 | 8.55 | 10.21 | 10.21 | | 7.29 | | 7.29 |
| Ebecryl 270 | 35.48 | 77.35 | 12.35 | 42.35 | 30.25 | 30.25 | 30.25 |
| Irgacure 2022 | 1.41 | 1.69 | 1.69 | 1.69 | 1.21 | 1.21 | 1.21 |
| CD-1012 | 0.48 | 0.75 | 0.75 | | 0.40 | | 0.40 |
| Elvacite 2028 | | | | | 8.56 | 8.56 | |
| Elvacite 4026 | | | | | | | |
| Elvacite 4056 | | | | | | | |
| Crack Length (μm) | 3943 | 3815 | 4187 | 4823 | 3346 | 3770 | 3491 |
| Approximate Thickness (um) | 8 | | | | | | |

Laminates with three glass layers were formed utilizing the polymer compositions in Table III to investigate the impact of the polymer compositions on the performance of the laminates, with all aspects of the laminates other than the polymer composition and thickness held constant. The average crack length reported in Table III was measured as the maximum crack length after dropping a ball onto the cured glass-based articles from a height of 75 mm, with the 1 st glass layer in contact with 120 grit sandpaper.

Additional laminated glass-based articles were prepared as reported in Table IV. The laminate stack was irradiated with ultraviolet light from a commercially available lamp to cure the resin. The UV exposure occurred at the indicated curing temperature $T_C$.

In Table IV, pre-heat time refers to the time for which the laminate was held at the curing temperature prior to UV irradiation. The cure time at Tc indicates the amount of time for which the UV irradiation occurred while the laminate was in the environment at the curing temperature.

TABLE IV

| Sample | 1st Glass Layer Comp. | 1st Glass Layer t (mm) | 2nd Glass Layer Comp. | 2nd Glass Layer t (mm) | 3rd Glass Layer Comp. | 3rd Glass Layer t (mm) | Polymer Comp. | Polymer t (μm) |
|---|---|---|---|---|---|---|---|---|
| 31 | B | 0.1 | A | 0.4 | B | 0.1 | UB45 | 4 |
| 32 | B | 0.1 | A | 0.4 | B | 0.1 | UB45 | 57 |
| 33 | B | 0.1 | A | 0.4 | B | 0.1 | UB45 | 3 |
| 34 | B | 0.1 | A | 0.4 | B | 0.1 | UB45 | 5 |
| 35 | B | 0.1 | B | 0.4 | B | 0.1 | UB45 | 3 |
| 36 | B | 0.1 | A | 0.4 | B | 0.1 | 67-3 | 7 |
| 37 | B | 0.1 | A | 0.55 | B | 0.1 | UB45 | <1 |
| 38 | B | 0.1 | A | 0.55 | B | 0.1 | 67-3 | 5-10 |
| 39 | B | 0.2 | A | 0.33 | B | 0.2 | UB45 | 2 |

| Sample | $T_C$ (° C.) | Pre-Heat Time (min) | Cure Time at $T_C$ (min) | Crack Length (μm) | CS (MPa) |
|---|---|---|---|---|---|
| 31 | >80 | 10 | 10 | 1805 | 29 |
| 32 | >80 | 10 | 10 | 2220 | 27 |
| 33 | <40 | 10 | 10 | 1837 | 10.4 |
| 34 | <40 | 10 | 10 | 1625 | 9.4 |
| 35 | >80 | 10 | 10 | 1574 | 4.7 |
| 36 | >80 | 10 | 10 | 1166 | 31.6 |

TABLE IV-continued

| | | | | | |
|---|---|---|---|---|---|
| 37 | 80 | 10 | 10 | 3990 | 13.5 |
| 38 | 80 | 10 | 10 | 3384 | 16 |
| 39 | 80 | 10 | 10 | 4455 | 21.2 |

The average crack length reported in Table IV was measured as the maximum crack length after dropping a ball onto the cured glass-based articles from a height of 75 mm, with the 1st glass layer in contact with 120 grit sandpaper. The compressive stress (CS) reported in Table IV was measured as described herein.

Additional laminated glass-based articles were prepared as reported in Table V. The laminate stack was irradiated with ultraviolet light from a commercially available lamp to cure the resin. The UV exposure occurred at the indicated curing temperature $T_C$.

In Table V, pre-heat time refers to the time for which the laminate was held at the curing temperature prior to UV irradiation. The cure time at $T_C$ indicates the amount of time for which the UV irradiation occurred while the laminate was in the environment at the curing temperature.

TABLE V

| | 1st Glass Layer | | 2nd Glass Layer | | 3rd Glass Layer | | Polymer | |
|---|---|---|---|---|---|---|---|---|
| Sample | Comp. | t (mm) | Comp. | t (mm) | Comp. | t (mm) | Comp. | t (μm) |
| 40 | B | 0.1 | A | 0.4 | B | 0.1 | UB45 | 20 |
| 41 | B | 0.1 | A | 0.4 | B | 0.1 | 37 | 17 |
| 42 | B | 0.1 | A | 0.4 | B | 0.1 | 67-3 | 14 |
| 43 | B | 0.1 | A | 0.4 | B | 0.1 | 67-2 | 9 |
| 44 | B | 0.1 | A | 0.4 | B | 0.1 | Norland 68 | 33 |
| 45 | B | 0.1 | A | 0.4 | B | 0.1 | Norland 89 | 11 |
| 46 | B | 0.1 | A | 0.55 | B | 0.1 | Emcast 1821HV (S1) | 15 |
| 47 | B | 0.1 | A | 0.55 | B | 0.1 | Emcast 1821HV (S2) | 43 |
| 48 | B | 0.1 | A | 0.55 | B | 0.1 | Optocast 3410 LC | 15 |
| 49 | B | 0.1 | A | 0.55 | B | 0.1 | Loctite 3491 | 30 |
| 50 | B | 0.1 | A | 0.55 | B | 0.1 | Lensbond 92 | 26 |
| 51 | B | 0.1 | A | 0.55 | B | 0.1 | Adhesive 740 | 27 |
| 52 | B | 0.1 | A | 0.55 | B | 0.1 | ELC 4M21 (S1) | 40 |
| 53 | B | 0.1 | A | 0.55 | B | 0.1 | ELC 4M21 (S2) | 30 |
| 54 | B | 0.1 | A | 0.55 | B | 0.1 | Optocast 3514 | 30 |
| 55 | B | 0.1 | A | 0.5 | B | 0.1 | Optocast 3514 | 89 |

| Sample | $T_C$ (° C.) | Pre-Heat Time (min) | Cure Time at $T_C$ (min) | Crack Length (μm) | CS (MPa) | $T_g$ (° C.) |
|---|---|---|---|---|---|---|
| 40 | 80 | 10 | 10 | 2,696 | 37.1 | 79 |
| 41 | 80 | 10 | 10 | 2,202 | 33.9 | 50 |
| 42 | 80 | 10 | 10 | 1,574 | 39.4 | 82 |
| 43 | 80 | 10 | 10 | 1,588 | | |
| 44 | 80 | 10 | 10 | 3,763 | | |
| 45 | 80 | 10 | 10 | 3,732 | | |
| 46 | 105 | 10 | 10 | 3560 | | |
| 47 | 105 | 10 | 10 | 4218 | | |
| 48 | 105 | 10 | 10 | 4270 | 29.6 | >10 |
| 49 | 105 | 10 | 10 | 4003 | 23 | 91 |
| 50 | 105 | 10 | 10 | 4317 | 27 | 30 |
| 51 | 105 | 10 | 10 | 4032 | 22.7 | |
| 52 | 105 | 10 | 10 | 3621 | 24.6 | |
| 53 | 105 | 10 | 10 | 3705 | 21.5 | |
| 54 | 105 | 10 | 10 | 3855 | | <10 |
| 55 | 20 | | | 12760 | | 10 |

The average crack length reported in Table V was measured as the maximum crack length after dropping a ball onto the cured glass-based articles from a height of 75 mm, with the 1st glass layer in contact with 120 grit sandpaper. The compressive stress (CS) reported in Table V was measured as described herein. The $T_g$ in Table V refers to the polymer.

Figure 8:
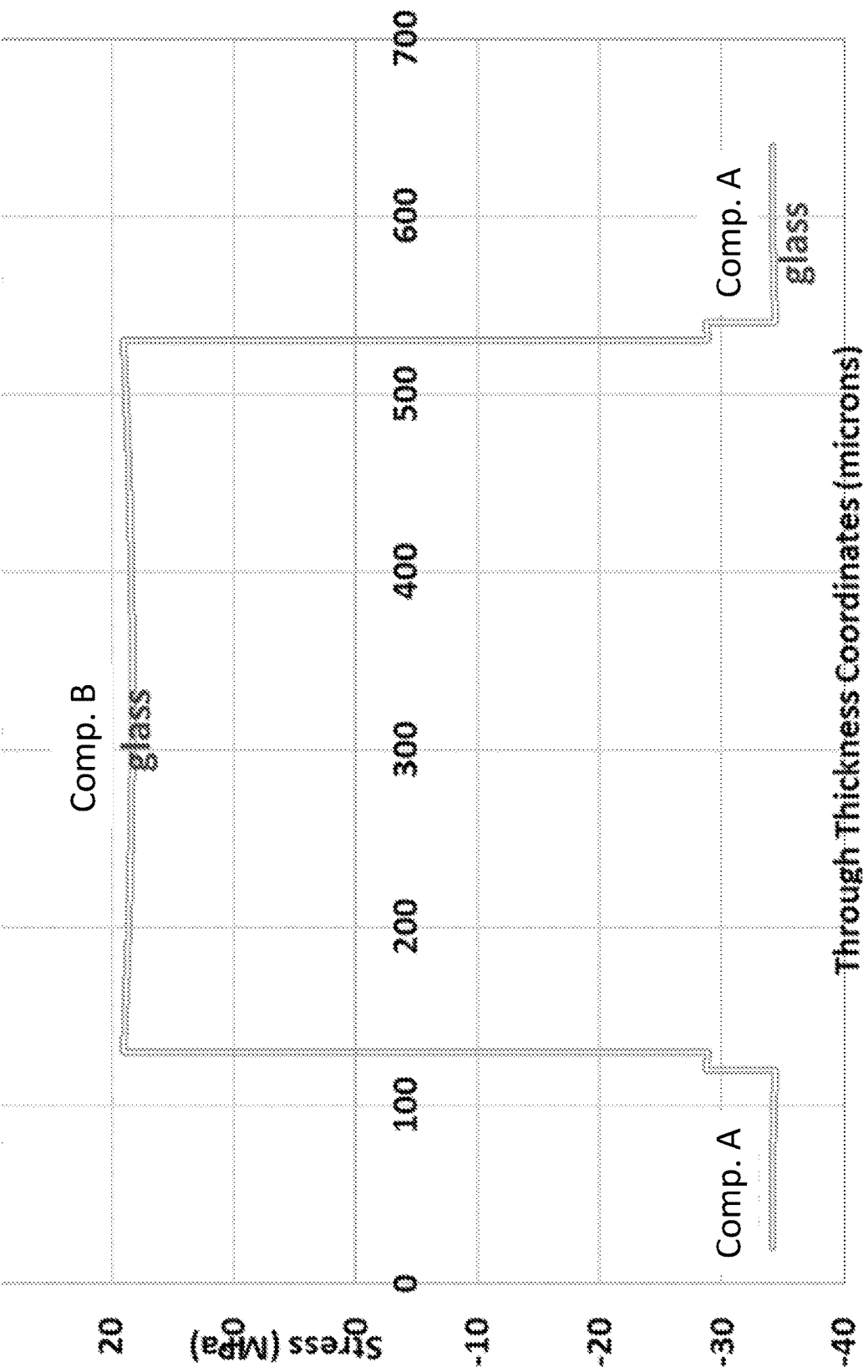
FIG. 8 is a plot of stress as a function of depth for a glass-based article according to an embodiment.

Additional laminated glass-based articles were prepared as reported in Table VI. The polymers utilized in the laminates of Table VI are films, and the laminates were cured in an autoclave. The adhesive films were tested with and without the addition of an adhesion promoter (AP).

calculated. The calculated stress profile is shown in FIG. 8. In FIG. 8 compressive stress has a negative value. As demonstrated in FIG. 8, curing at low temperatures can produce stresses equivalent to those produced by curing at high temperatures with the glass layers reversed. The arrangement that is cured at low temperatures provides the added benefit of the exposed glass layers being ion exchangeable glasses, which allows the exposed glass layers to be chemically strengthened.

A laminate including a 1st glass layer of composition B with a thickness of 100 μm, a 2nd glass layer of composition A with a thickness of 550 μm, a 3rd glass layer of compo-

TABLE VI

| Sample | 1st Glass Layer Comp. | t (mm) | 2nd Glass Layer Comp. | t (mm) | 3rd Glass Layer Comp. | t (mm) | Polymer Comp. | t (μm) | $T_g$ (° C.) | Crack Length (μm) | CS (MPa) |
|---|---|---|---|---|---|---|---|---|---|---|---|
| 100 | B | 0.1 | A | 0.4 | B | 0.1 | PVB Mowital w/AP | 56 | 60-70 | 4167 | 35.3 |
| 101 | B | 0.1 | A | 0.4 | B | 0.1 | PVB Mowital no AP | 56 | 60-70 | 3937 | 34.6 |
| 102 | B | 0.1 | A | 0.4 | B | 0.1 | PVB Mowital w/AP | 52 | 60-70 | 3841 | 31.2 |
| 103 | B | 0.1 | A | 0.4 | B | 0.1 | PVB Mowital no AP | 53 | 60-70 | 4105 | 33.8 |
| 104 | B | 0.1 | A | 0.4 | B | 0.1 | TOPAS 6013S-KV | 60 | 138 | 5805 | 67.9 |
| 105 | B | 0.1 | A | 0.4 | B | 0.1 | TOPAS 6013S-TK | 50 | 138 | 6133 | 65.8 |
| 106 | B | 0.1 | A | 0.4 | B | 0.1 | Surlyn PC2000 | 47 | 84 | 5090 | 14.7 |
| 107 | B | 0.1 | A | 0.4 | B | 0.1 | SentryGlas N-UV | 52 | 94 | 5526 | 13.7 |

The average crack length reported in Table VI was measured as the maximum crack length after dropping a ball onto the cured glass-based articles from a height of 75 mm, with the 1 st glass layer in contact with 120 grit sandpaper. The compressive stress (CS) reported in Table VI was measured as described herein.

Figure 6:
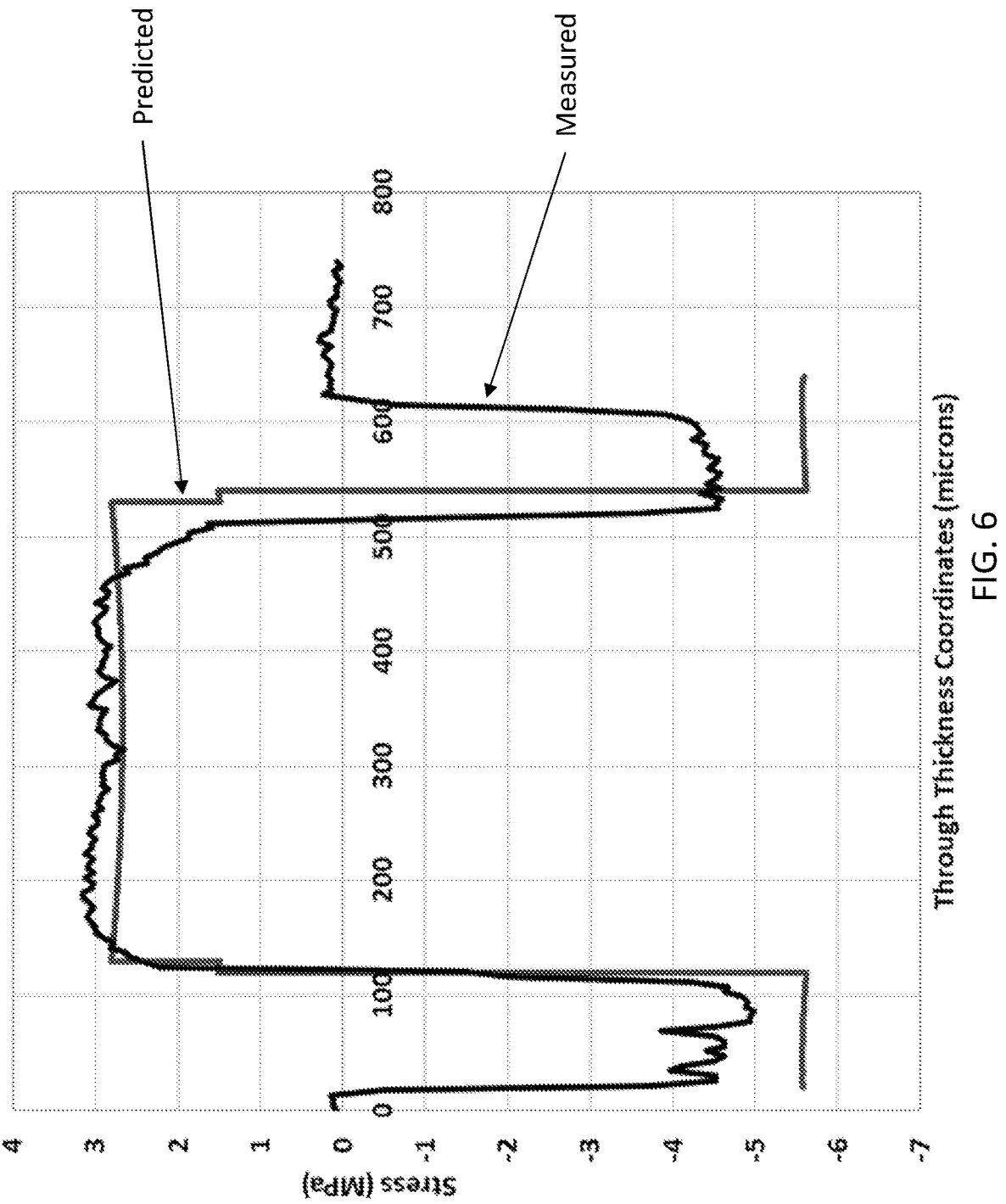
FIG. 6 is a plot of stress as a function of depth for a glass-based article according to an embodiment.

A laminate including a 1 st glass layer of composition B with a thickness of 100 μm, a 2nd glass layer of composition A with a thickness of 400 μm, a 3rd glass layer of composition B with a thickness of 100 μm, and polymer layers of UB45 was prepared. The laminate was cured at 40° C. and the stress profile measured by the SCALP technique. The measured stress profile is shown in FIG. 6, along with the calculated stress based on the CTE mismatch of the glass layers. In FIG. 6 compressive stress has a negative value.

Figure 7:
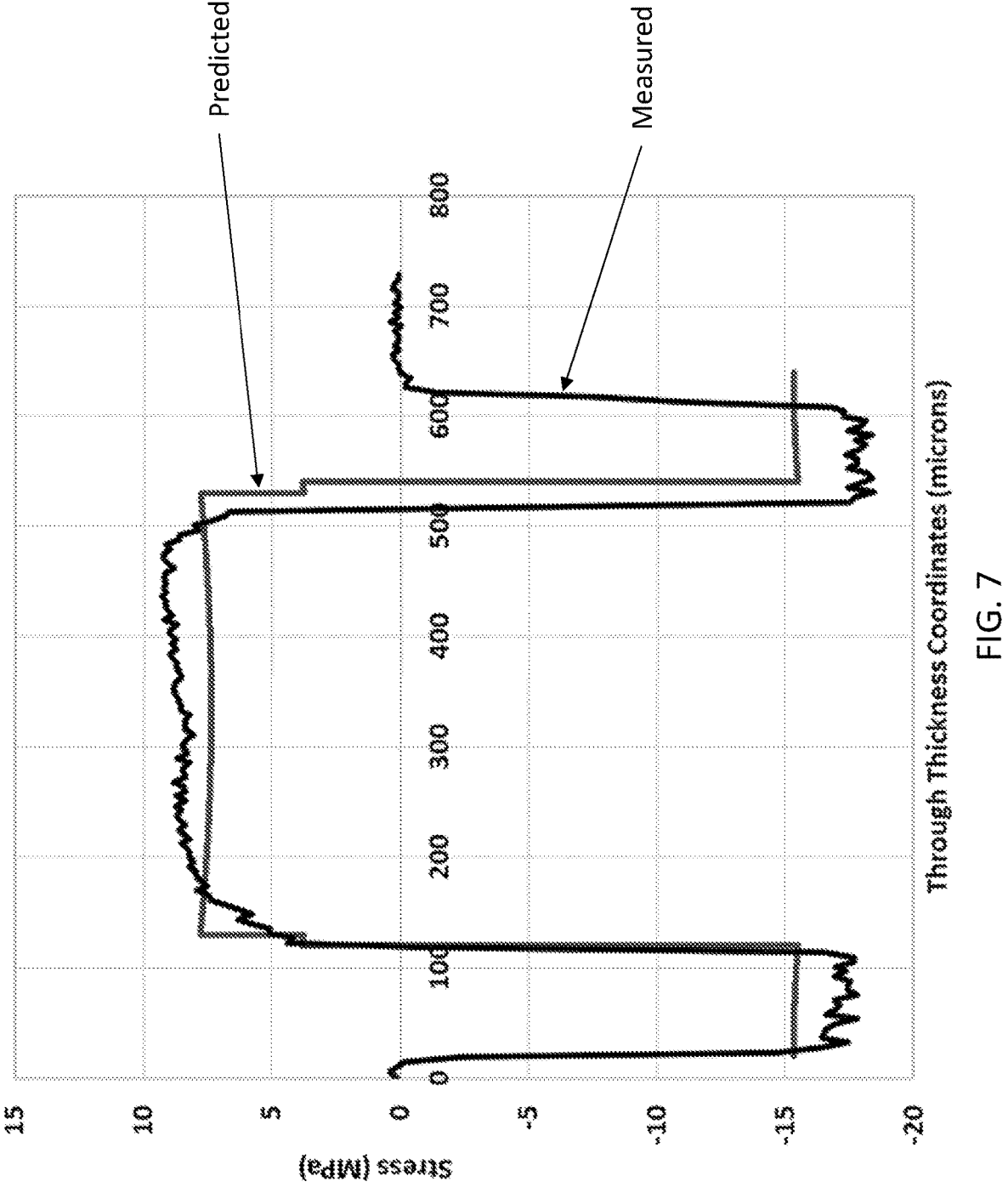
FIG. 7 is a plot of stress as a function of depth for a glass-based article according to an embodiment.

A laminate including a 1st glass layer of composition B with a thickness of 100 μm, a 2nd glass layer of composition A with a thickness of 400 μm, a 3rd glass layer of composition B with a thickness of 100 μm, and polymer layers of UB45 was prepared. The laminate was cured at 100° C. and the stress profile measured by the SCALP technique. The measured stress profile is shown in FIG. 7, along with the calculated stress based on the CTE mismatch of the glass layers. In FIG. 7 compressive stress has a negative value.

Figure 9:
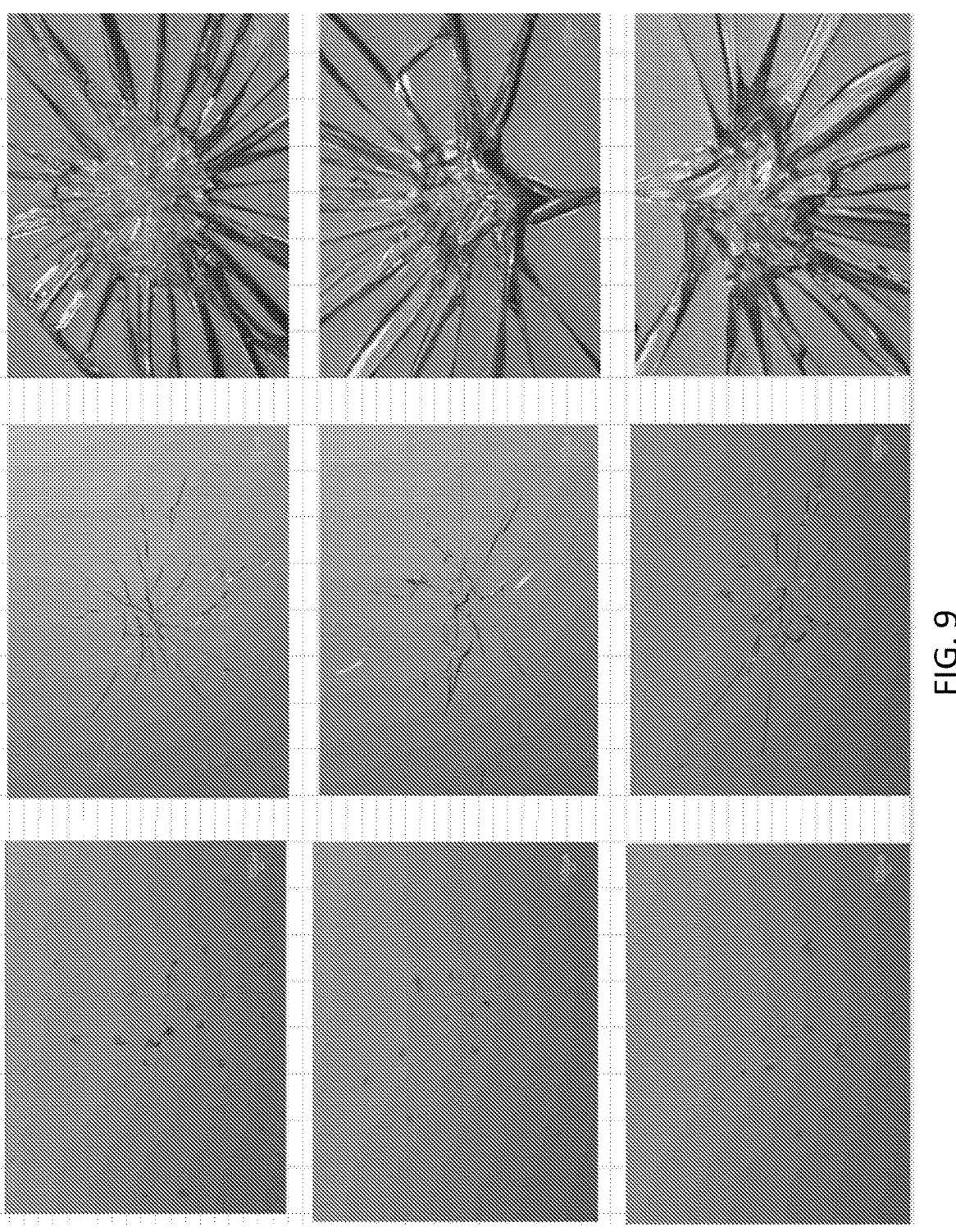
FIG. 9 is photographs after a steel rod drop test of glass-based articles according to embodiments, laminate articles cured at room temperature, ion exchanged glass monoliths.

The stress profile for a laminate including a 1st glass layer of composition A with a thickness of 100 μm, a 2nd glass layer of composition B with a thickness of 400 μm, a 3rd glass layer of composition A with a thickness of 100 μm, and polymer layers of UB45 was prepared cured at −100° C. was sition B with a thickness of 100 μm, and polymer layers of UB45 was prepared. The laminate was cured at 133° C. with an 8-minute pre-heat at 133° C., and identical samples were cured at room temperature. The cured laminates were damaged by dropping a 16 g steel rod with a rounded tip onto the laminates that were placed over 120 grit SiC sandpaper mounted to a steel base. The rod drove the backside of the laminate into the sandpaper and the bending placed the impact flaws into tension, driving the cracks laterally through the sample. This test was also performed on monolithic ion exchanged glasses of composition A, all samples of which broke on the first impact as shown by the 3 samples in the right column of FIG. 9. The laminates were impacted 5 times in different locations and the crack sizes averaged to assess performance. The laminates shown in the middle column of FIG. 9, cured at room temperature, show cracks that arrest after a few mm, while the samples in the left column which were cured at 133° C. show no visible cracking, just localized damage from the sharp sandpaper grit. Interestingly, when a monolith of composition B of similar thickness was impacted, the lateral extent of the crack system was similar to those for the laminates, suggesting that the lateral extent is largely driven by the indentation stress field.

Figure 10:
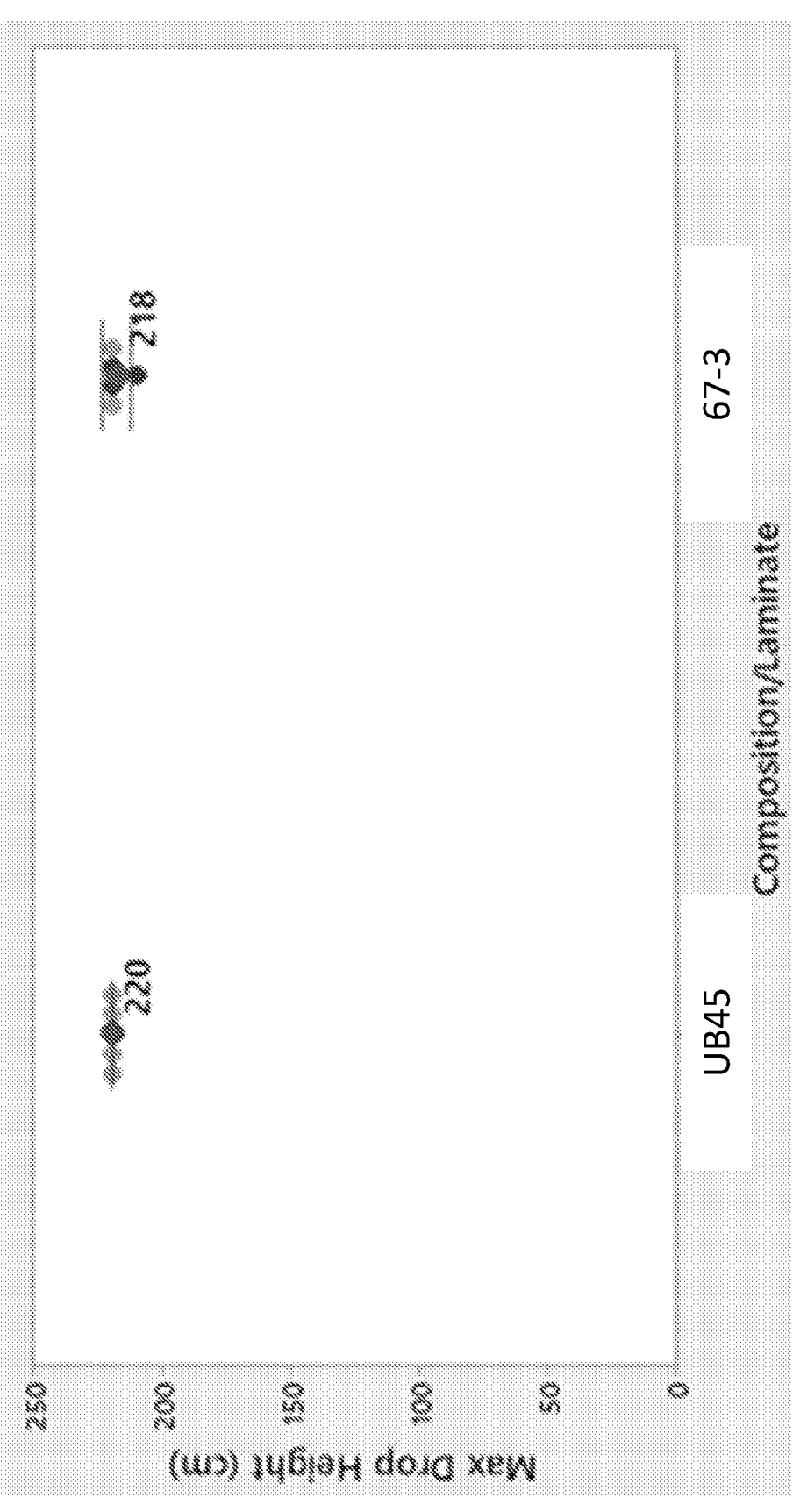
FIG. 10 is a plot of the maximum drop height on 30 grit sandpaper for glass-based articles according to embodiments.
Figure 11:
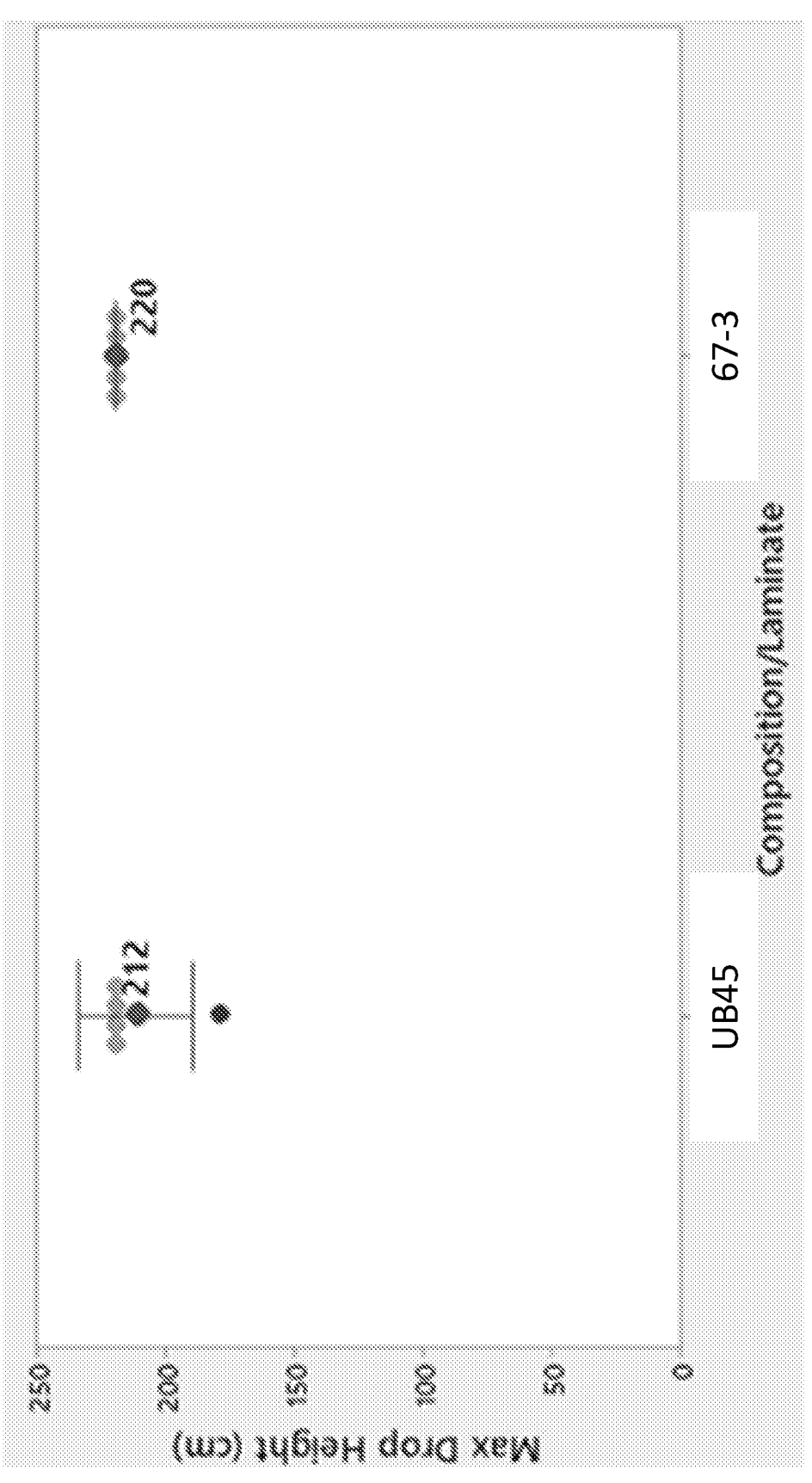
FIG. 11 is a plot of the maximum drop height on smooth granite for glass-based articles according to embodiments.

A laminate including a 1st glass layer of composition B with a thickness of 100 μm, a 2nd glass layer of composition A with a thickness of 550 μm, a 3rd glass layer of composition B with a thickness of 100 μm, and polymer layers of UB45 was prepared. Another laminate including a 1st glass layer of composition B with a thickness of 100 μm, a 2nd glass layer of composition A with a thickness of 550 μm, a 3rd glass layer of composition B with a thickness of 100 μm, and polymer layers of 67-3 was prepared. The laminates were then laser cut into phone size parts, edge finished and then mounted into phone simulating test vehicles. These test vehicles were then dropped from 20 cm height onto 30 grit sandpaper on a steel plate. If the laminates survived (did not fracture) they were dropped again from a 20 cm greater height, and this process was repeated until failure. None of the laminates with the UB45 adhesive failed up to 220 cm, as shown in FIG. 10. Some of the laminates with 67-3 adhesive failed at heights above 200 cm. For the sake of comparison, commercially available monolithic ion exchanged glass were also tested and all failed at drop heights below 100 cm. These laminates in the test vehicles were also dropped on smooth granite to apply a bending stress to the laminate parts. All five of the 67-3 laminates passed, while one of the five UB45 laminates failed at 180 cm as shown in FIG. 11.

Figure 12:
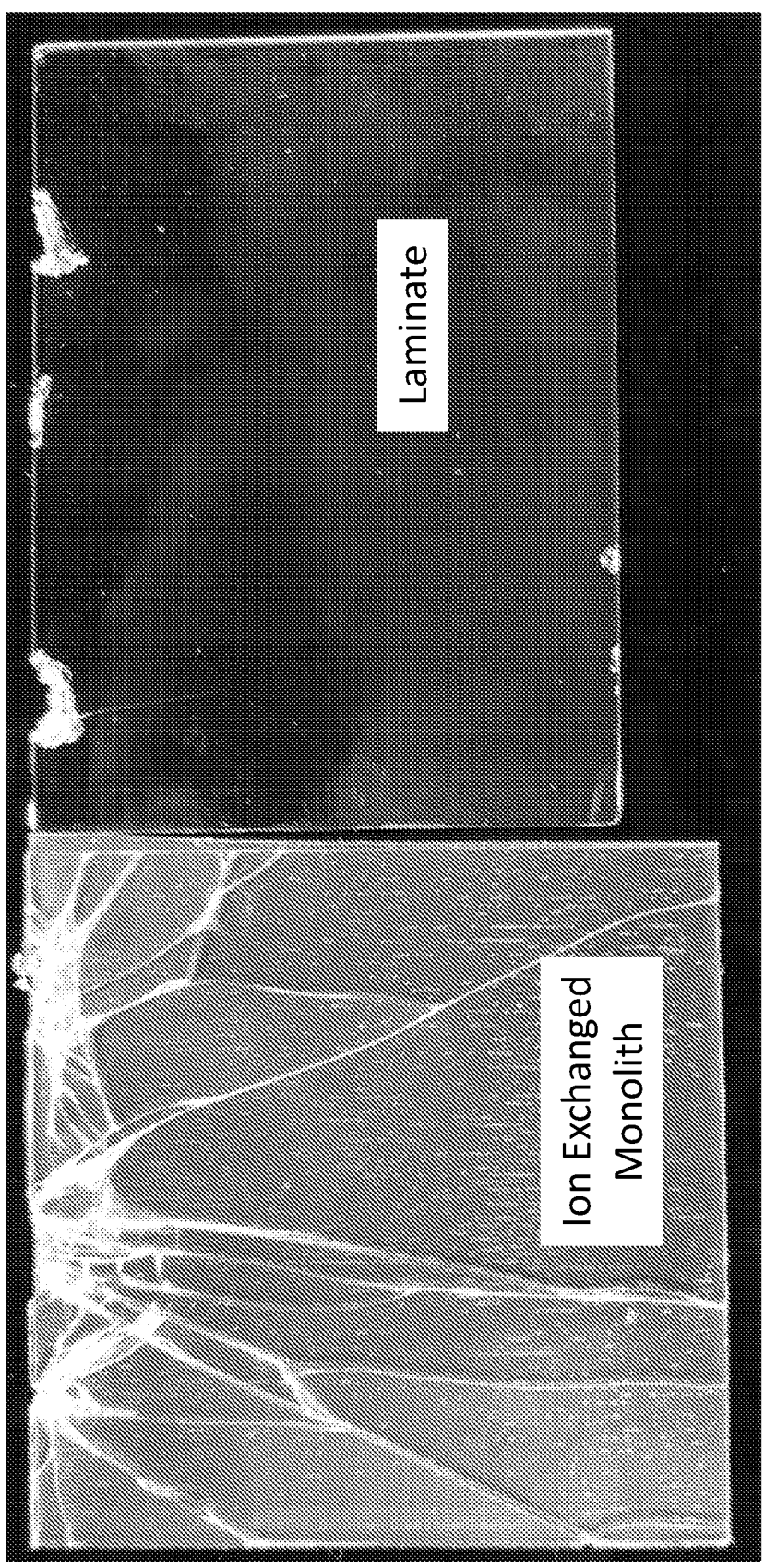
FIG. 12 is a photograph of edge impact test results for a comparative monolithic ion exchanged glass and a glass-based article according to embodiments.

A 38 g steel rod was dropped from 25 cm directly onto the edge of 50 mm wide samples held vertically on a lab bench. A monolithic ion exchanged glass with a score and break edge broke in 3 out of 3 trials. Each laminate was struck 3 times on each edge and survived 10 out of 10 trials. While there was impact damage and chipping on the laminates, surprisingly the rest of the glass was unscathed as shown in FIG. 12. As shown in FIG. 12, the failure of the monolithic ion exchanged glass was catastrophic. These results are heavily influenced by both the edge strength (pre-existing flaw population) and the edge profile (stress on impact). The edges of the laminates were processed to create a high strength, small flaw population on the edge. A cantilever curl that occurred as a result of the score and break process, which typically leads to low impact force/speed failures, was also removed.

Figure 13:
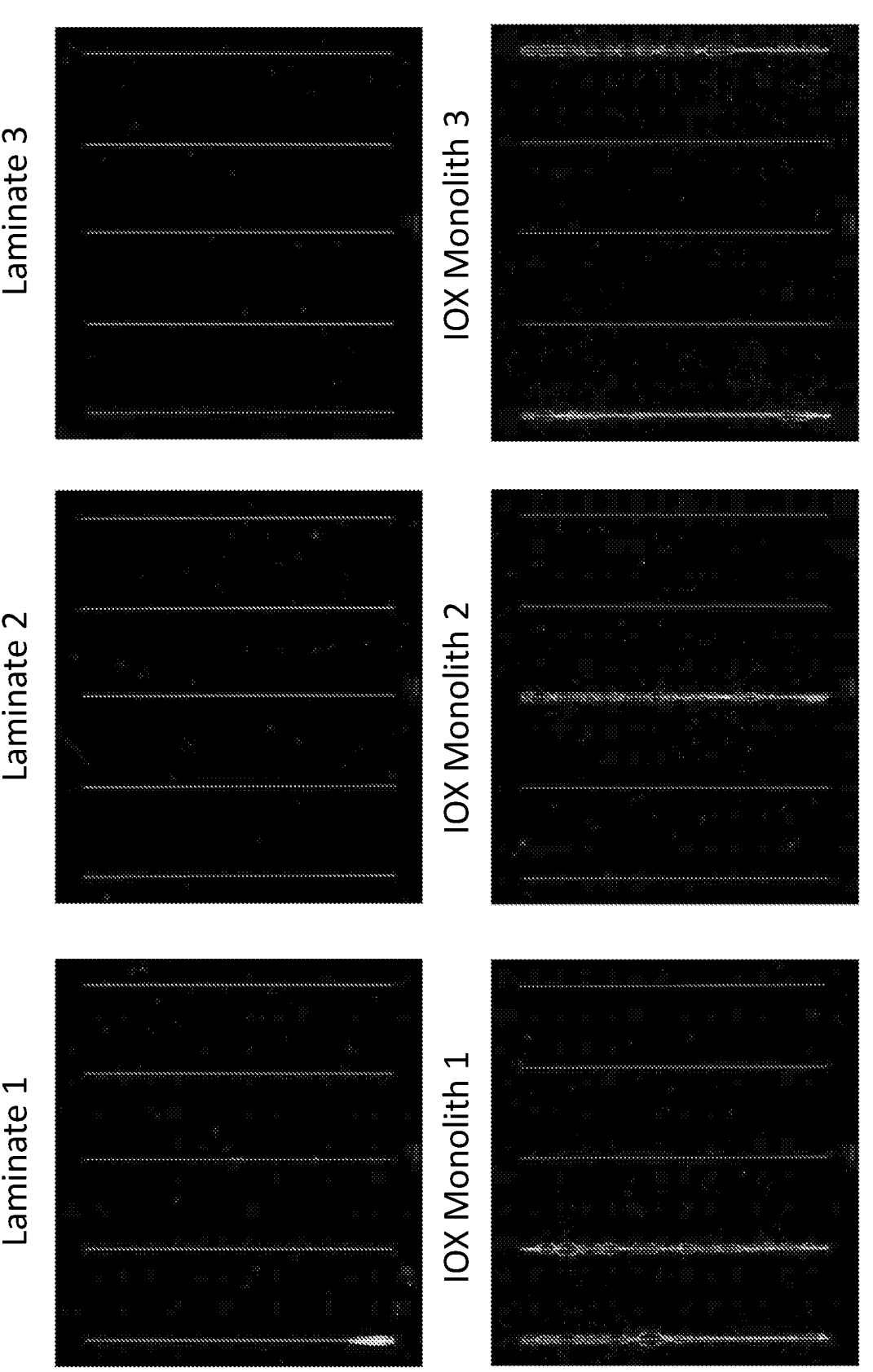
FIG. 13 is photographs of Knoop scratch performance test results at a 5N load for a comparative monolithic ion exchanged glass and a glass-based article according to embodiments.

The prepared laminates also exhibited improved scratch performance when compared to an ion exchanged lithium aluminosilicate monolith, as shown in FIG. 13. A Knoop diamond was pulled across three samples each of the laminate and the monolith with a load of 5 N, and the resultant scratches are shown in FIG. 13. The laminates only showed one partial instance of delamination, with lateral cracking observed in multiple instances for the ion exchanged monolith. The Knoop scratch threshold for laminates of the type described herein was observed to exceed 16 N, while monolithic ion exchanged glasses often exhibit a Knoop scratch threshold of less than 8 N.

Figure 14:
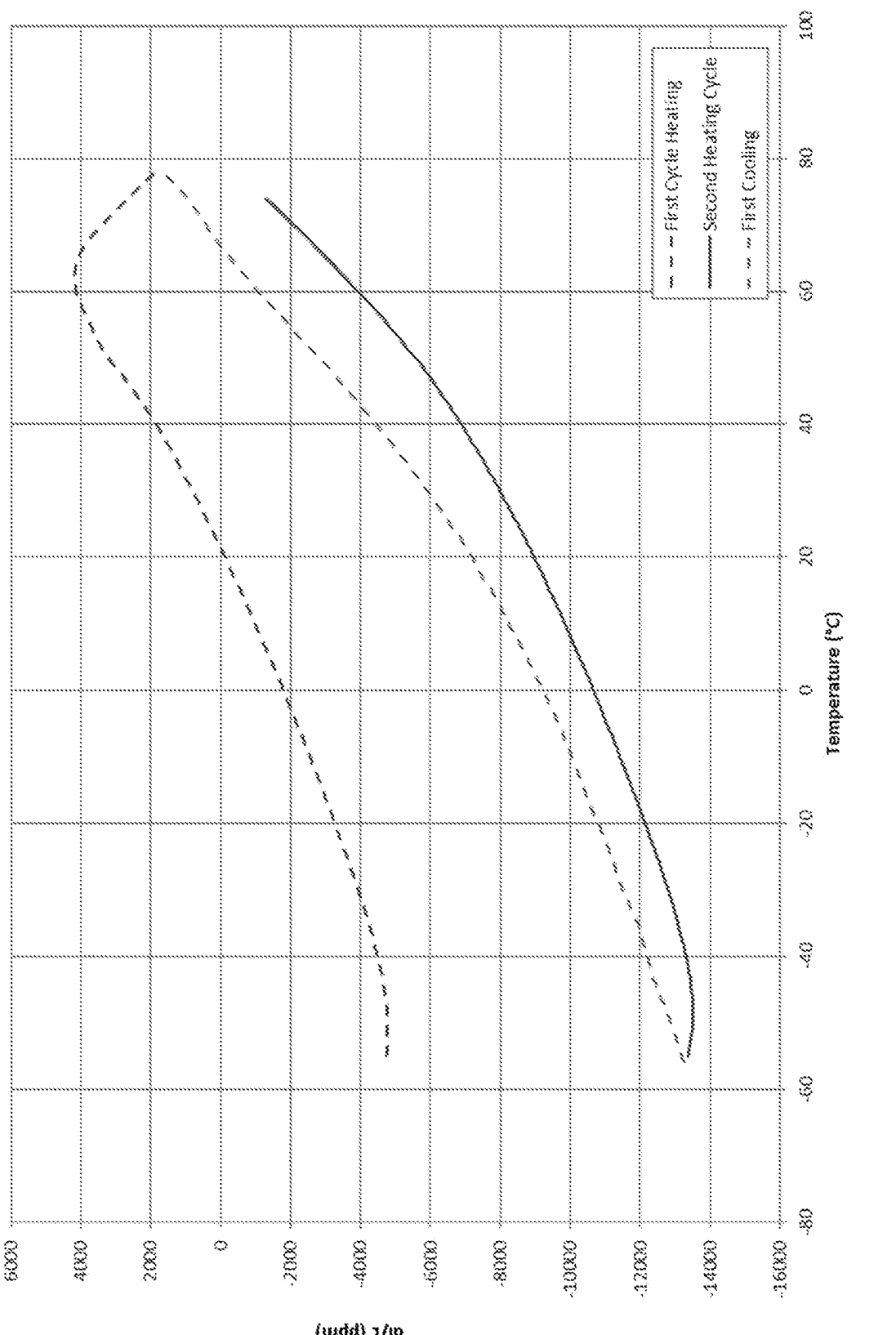
FIG. 14 is a plot of the thermal expansion behavior of the UB20 polymer as a function of temperature and successive heating cycles.

The thermal expansion and contraction of cured UB20 was measured, as shown in FIG. 14. Note that the UB20 polymer shrinks above 60° C., which imparts further compression on the glass layers and may also increase adherence to the glass. Upon cooling the UB20 shrinks at a rate of 135 ppm/° C., while most glass shrinks at a rate of ≤10 ppm/° C. which will put most glasses into compression upon cooling from an elevated cure temperature. This effect is much smaller than that of the stress arising from the CTE mismatch of the glass layers because the glasses are much thicker and stiffer than the thin polymer layers. However, the CTE difference from the glass layers and the polymer shrinkage on curing can still enhance the stress and provide further compression on the exposed glass layers, which is beneficial.

Figure 15:
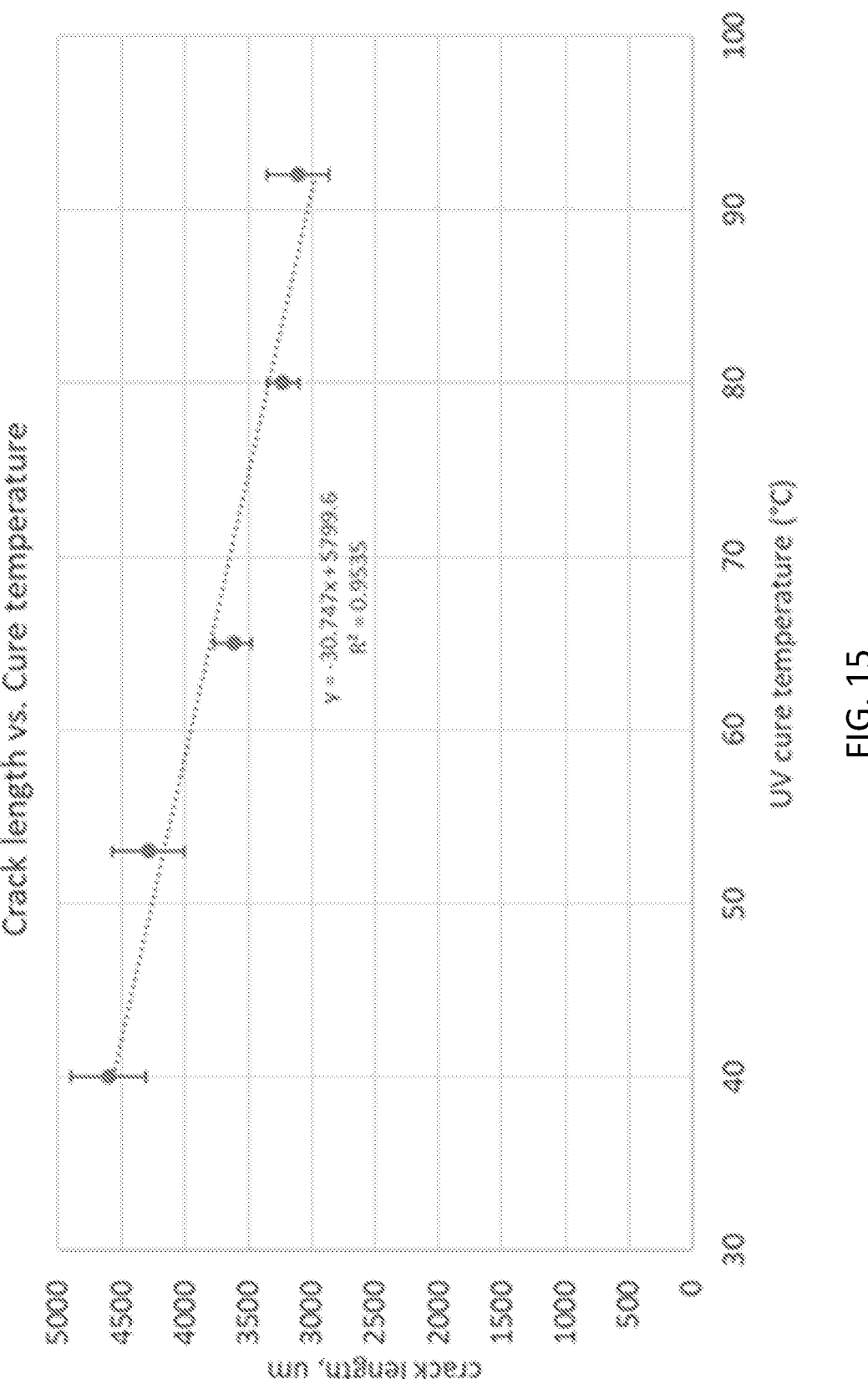
FIG. 15 is a plot of average crack length as a function of cure temperature for a glass-based article according to an embodiment.

The effect of cure temperature on the crack length was investigated. A laminate including a 1st glass layer of composition B with a thickness of 100 μm, a 2nd glass layer of composition A with a thickness of 550 μm, a 3rd glass layer of composition B with a thickness of 100 μm, and polymer layers of 15 μm thick UB45 was prepared. The laminate was then cured by UV irradiation at various temperatures, and the average crack length was determined as described herein. As shown in FIG. 15, the greater the cure temperature the lower the average crack length. Without being bound by any particular theory, this result may be due to increased compression on the exposed glass due to the increased curing temperature, particularly when any global bending stresses may be present. The largest cracks are on average 30 μm shorter per every degree C. the cure temperature is increased. Part of this performance is due to the CTE mismatch, some from shrinkage of the polymer, and some likely from increased adherence of the polymer to the glass layers.

Figure 16:
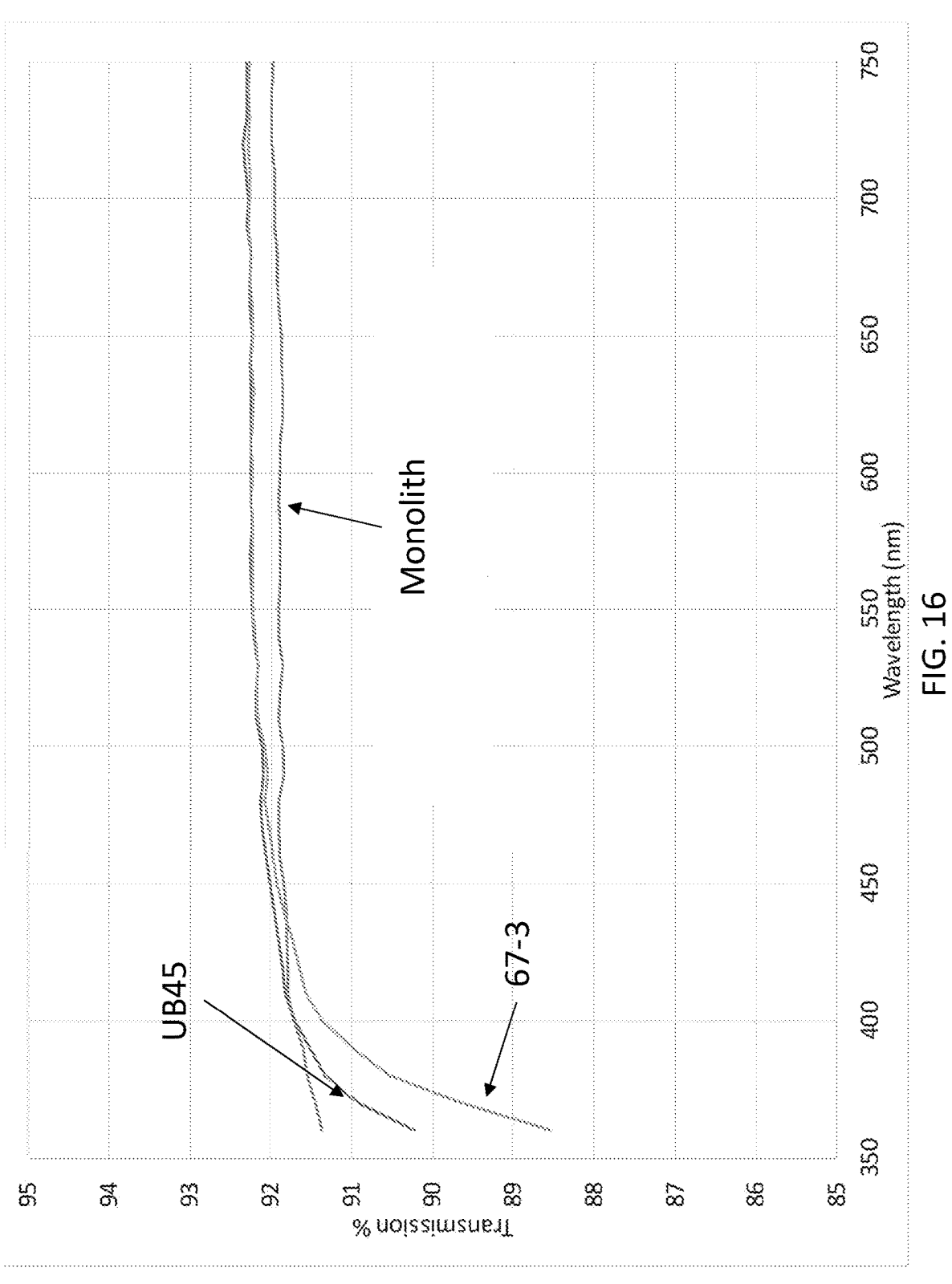
FIG. 16 is a plot of the transmission as a function of wavelength for a monolithic glass article and glass-based articles according to embodiments.

A laminate including a 1st glass layer of composition B with a thickness of 100 μm, a 2nd glass layer of composition A with a thickness of 550 μm, a 3rd glass layer of composition B with a thickness of 100 μm, and polymer layers of UB45 was prepared. Another laminate including a 1st glass layer of composition B with a thickness of 100 μm, a 2nd glass layer of composition A with a thickness of 550 μm, a 3rd glass layer of composition B with a thickness of 100 μm, and polymer layers of 67-3 was prepared. The transmission of the laminates after UV curing at 100° C. was measures as shown in FIG. 16, indicating that the laminates also have excellent optical performance. The transmission of a monolithic glass with a thickness of 0.8 mm is also shown in FIG. 16 for the sake of comparison.

Figure 17:
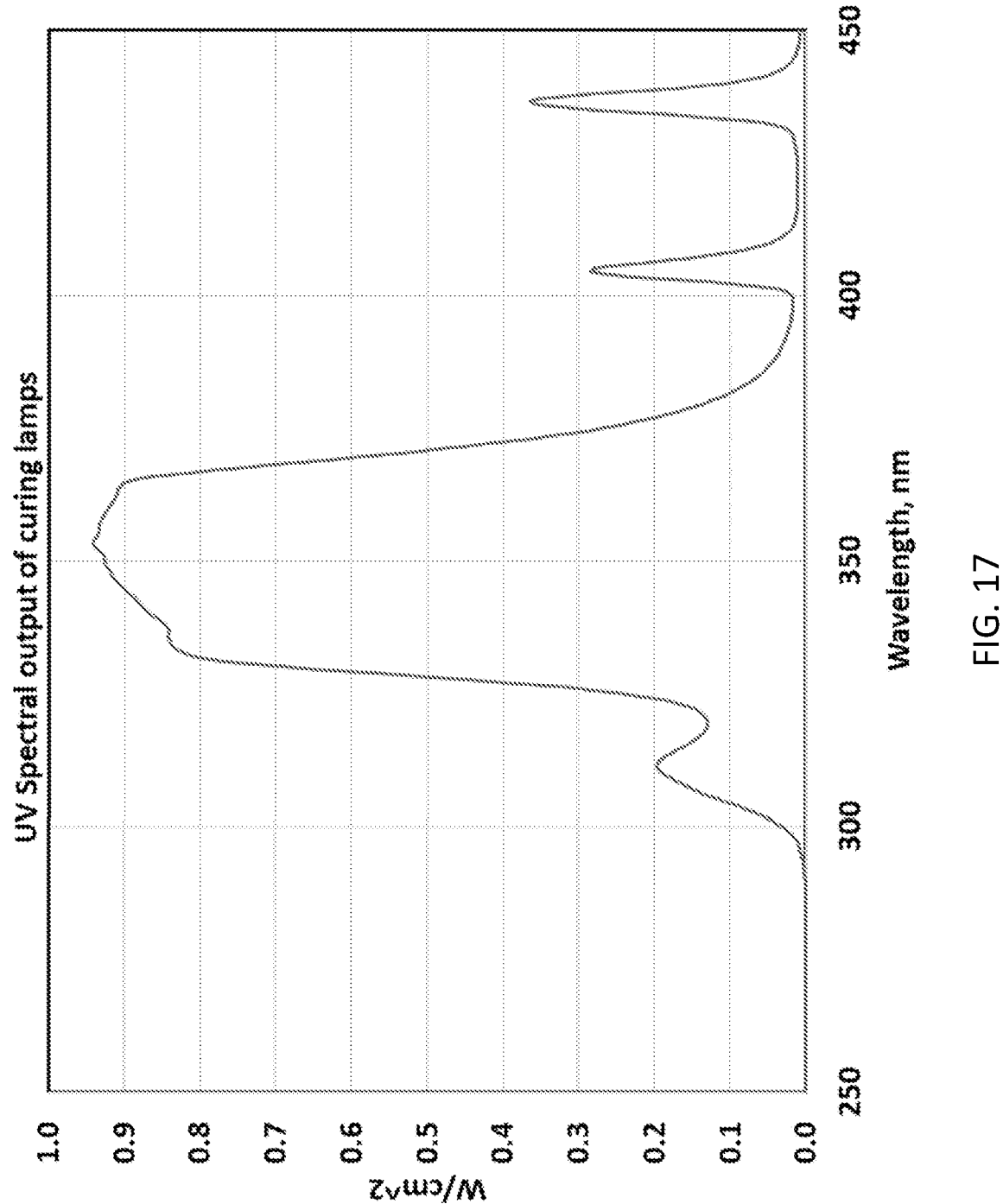
FIG. 17 is the UV spectral output of a lamp utilized to cure the glass-based articles according to embodiments.

The spectral output of the UV lamp utilized herein to cure the polymers was measured and is reported in FIG. 17.

Figure 18:
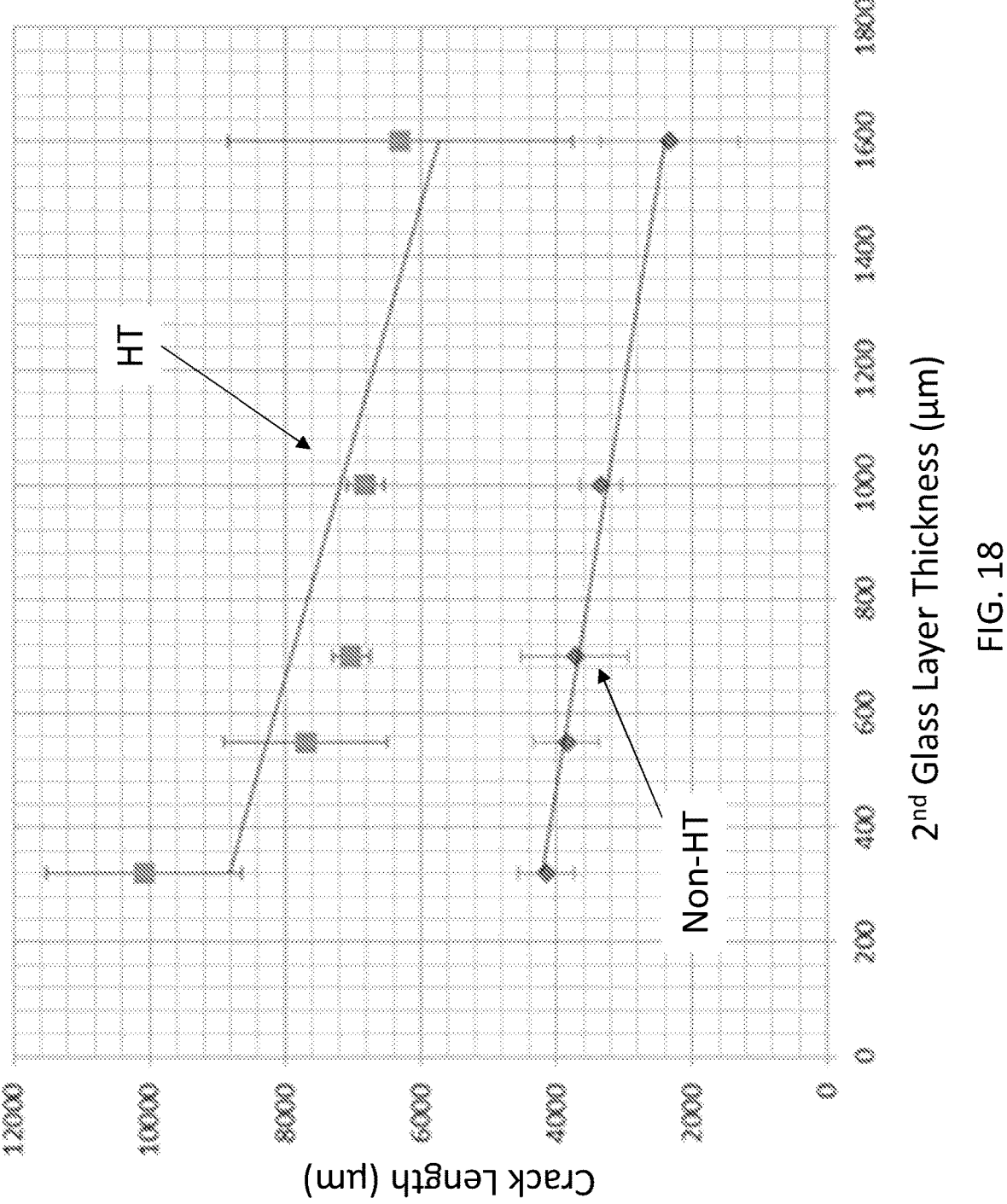
FIG. 18 is a plot of average crack length as a function of 2nd glass layer thickness for glass-based articles according to embodiments.

Asymmetric laminates (including only 2 glass layers) were produced. The asymmetric laminates included a 1st glass layer of composition B with a thickness of 100 μm, a 2nd glass layer of composition A with various thicknesses, and a polymer layer disposed between the glass layers. The laminates were cured at 130° C. (HT) and additional laminates were cured at room temperature (non-HT). The average crack length was then measured as described herein. As shown in FIG. 18, a thicker 2nd glass layer improves crack length performance for asymmetric laminates, and a similar effect is expected for symmetric laminates. The asymmetric laminates exhibited some warp, and a slightly reduced compressive stress due to the loss of stress in creating the warp.

Carbon nanotubes may be included in the polymer layers to improve the performance of the laminates. The carbon nanotubes may be multi-walled carbon nanotubes (MWCNT) and may be amino-modified (MWCNT-NH$_2$). Laminates where the polymer layer was 1% MWCNT-NH$_2$ doped Cotronics 4460 epoxy with 0.5% 3-aminopropyltrimethoxysilane were compared to identical laminates where the polymer layer was non-doped Cotronics 4460 epoxy with 0.5% 3-aminopropyltrimethoxysilane. The MWCNT-NH$_2$ containing laminates and were shown to have an improvement of about 28% reduction in ball drop crack testing. The MWCNT-NH$_2$ were purchased from NanoAmor and were pre-dispersed into N-methyl-2-pyrrolidone (NMP) prior to doping into the Cotronics 4460 0.5% 3-aminopropyltrimethoxysilane. The non-doped Cotronics 4460 0.5% 3-aminopropyltrimethoxysilane laminates had an average measured crack length of 3748±170 μm while the 1% MWCNT-NH$_2$ doped Cotronics 4460 0.5% 3-aminopropyltrimethoxysilane laminates had an average measured crack length of 2715±465 μm. The MWCNT have high aspect ratios >100 times their diameter and have a Young's modulus of 1 TPa and a tensile strength of 63 GPa.

Figure 19:
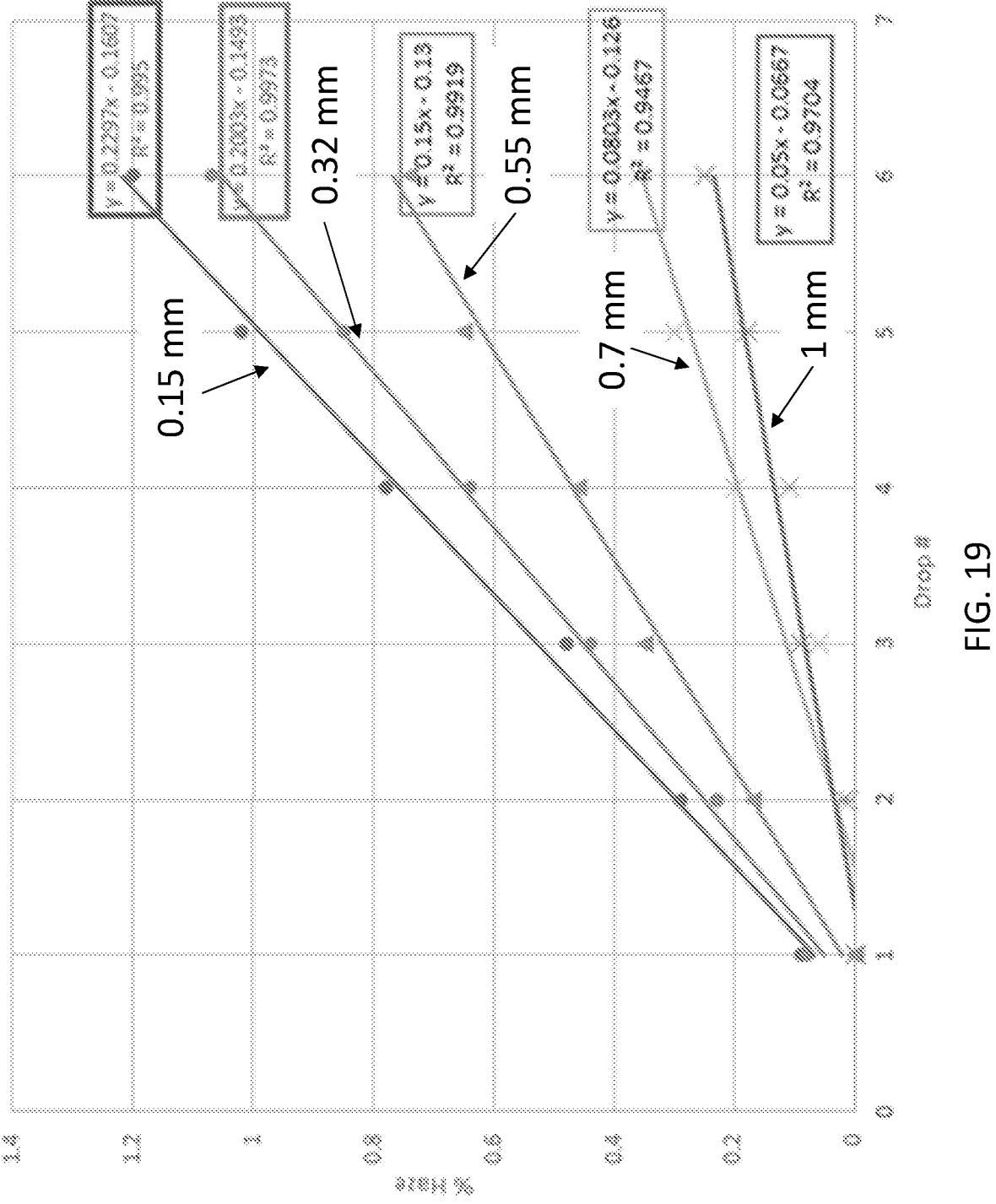
FIG. 19 is a plot of haze as a function of the number of ball drops for glass-based articles according to embodiments.

Laminates were prepared where all features were held constant except for the thickness of the 2nd glass layer, which varied. The laminates were subjected to repeated drops of a ball onto the cured glass-based articles from a height of 75 mm, with the 1st glass layer in contact with 120 grit sandpaper. The haze of the laminates was measured after each drop and is reported in FIG. 19. As shown in FIG. 19, the haze produced decreases with increasing thickness of the 2nd glass layer. Haze was measured using a Haze-gard Transparency Transmission Haze Meter, according to ASTM D1003 using Illuminant C.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. An article, comprising:

a first glass-based layer having a thickness $t_{G1}$ and a coefficient of thermal expansion $CTE_{G1}$;

a second glass-based layer having a thickness $t_{G2}$ and a coefficient of thermal expansion $CTE_{G2}$; and a first polymer layer disposed between the first glass-based layer and the second glass-based layer having a thickness $t_{P1}$ and a coefficient of thermal expansion $CTE_{P1}$, wherein the first glass-based layer comprises a compressive stress that is greater than or equal to 5 MPa at least partially imparted by shrinkage of the polymer layer, and $$|CTE_{G1}-CTE_{G2}|>0.4 \text{ ppm/}° \text{ C.,}$$

wherein $t_{G1}{\leq}300$ μm, and wherein the compressive stress that the first glass-based layer exhibits is not attributable to chemical strengthening or thermal tempering.

2. The article of claim 1, further comprising:

a third glass-based layer having a thickness $t_{G3}$ and a coefficient of thermal expansion $CTE_{G3}$; and a second polymer layer disposed between the second glass-based layer and the third glass-based layer having a thickness $t_{P2}$ and a coefficient of thermal expansion $CTE_{P2}$, wherein the third glass-based layer comprises a compressive stress, and $$|CTE_{G3}-CTE_{G2}|>0.4 \text{ ppm/}° \text{ C.}$$

3. The article of claim 2, wherein one or more of the following is satisfied:

$t_{G1}{=}t_{G3}$;

$t_{G3}{\leq}300$ μm; and $t_{P2}{\leq}150$ μm.

4. The article of claim 1, wherein each of the following is satisfied:

$t_{G2}{\geq}200$ μm;

$t_{G2}{\leq}2000$ μm; and $t_{P1}{\leq}150$ μm.

5. The article of claim 1, wherein $t_{G1}+t_{G2}+t_{P1}{<}20$ mm.

6. The article of claim 1, wherein $$|CTE_{G1}-CTE_{G2}|>0.5 \text{ ppm/}° \text{ C.}$$

7. The article of claim 1, wherein the first glass-based layer comprises a compressive stress that is within a range of from 5 MPa to 95 MPa.

8. The article of claim 1, wherein the compressive stress varies over the thickness of the first glass-based layer by less than 20% of the average compressive stress.

9. The article of claim 1, wherein the first glass-based layer comprises a compressive stress greater than or equal to 200 MPa.

10. The article of claim 1, wherein $CTE_{P1}-(CTE_{G1}+CTE_{G2})/2>1$ ppm/° C.

11. The article of claim 1, wherein the second glass-based layer has at least one of:

a Young's modulus of greater than or equal to 5 GPa; and a Young's modulus that is greater than a Young's modulus of the first polymer layer.

12. The article of claim 1, wherein the first glass-based layer has a Knoop scratch threshold greater than or equal to 6 N.

13. The article of claim 1, wherein at least one of the first glass-based layer and the second glass-based layer comprises an aluminoborosilicate glass, an aluminosilicate glass, or a soda-lime glass.

14. The article of claim 1, wherein the first glass-based layer is alkali free.

15. A consumer electronic product, comprising:

a housing having a front surface, a back surface and side surfaces;

electrical components provided at least partially within the housing, the electrical components including at least a controller, a memory, and a display, the display being provided at or adjacent the front surface of the housing; and a cover substrate disposed over the display, wherein at least a portion of at least one of the housing and the cover substrate comprises the article of claim 1.

* * * * *